(12) United States Patent
Ni et al.

(10) Patent No.: US 7,944,702 B2
(45) Date of Patent: May 17, 2011

(54) PRESS-PUSH FLASH DRIVE APPARATUS WITH METAL TUBULAR CASING AND SNAP-COUPLED PLASTIC SLEEVE

(75) Inventors: Jim Chin-Nan Ni, San Jose, CA (US); Nan Nan, San Jose, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 12/834,647

(22) Filed: Jul. 12, 2010

(65) Prior Publication Data

US 2010/0281209 A1   Nov. 4, 2010

Related U.S. Application Data

(63) Continuation-in-part of application No. 12/361,772, filed on Jan. 29, 2009, now Pat. No. 7,869,219, which is a continuation-in-part of application No. 12/025,706, filed on Feb. 4, 2008, now Pat. No. 7,886,108, which is a continuation-in-part of application No. 11/845,747, filed on Aug. 27, 2007, which is a continuation-in-part of application No. 12/604,309, filed on Oct. 22, 2009, now Pat. No. 7,806,705, which is a continuation-in-part of application No. 12/171,194, filed on Jul. 10, 2008, now Pat. No. 7,771,215.

(51) Int. Cl.
*H05K 1/14* (2006.01)

(52) U.S. Cl. ....................................... 361/737

(58) Field of Classification Search .................. 361/737, 361/756, 741, 736, 760, 764, 752, 728–730; 439/76.1, 660, 946, 55
See application file for complete search history.

(56) References Cited

U.S. PATENT DOCUMENTS

| | | | |
|---|---|---|---|
| 4,582,985 A | 4/1986 | Lofberg |
| 4,630,201 A | 12/1986 | White |
| 4,766,293 A | 8/1988 | Boston |
| 4,833,554 A | 5/1989 | Dalziel et al. |
| 4,926,480 A | 5/1990 | Chaum |
| 5,020,105 A | 5/1991 | Rosen et al. |
| 5,180,901 A | 1/1993 | Hiramatsu |
| 5,280,527 A | 1/1994 | Gullman et al. |
| 5,404,485 A | 4/1995 | Ban |

(Continued)

FOREIGN PATENT DOCUMENTS

JP    63-163589 A    7/1988
(Continued)

*Primary Examiner* — Jean F Duverne
(74) *Attorney, Agent, or Firm* — Bever, Hoffman & Harms, LLP; Patrick T. Bever

(57) ABSTRACT

A press-push type computer peripheral "flash drive" device includes an elongated (e.g., metal) tubular casing containing a PCBA having a plug connector. A plastic housing assembly includes front and rear cap portions mounted over the open ends of the tubular casing, and a fixed plastic sleeve portion disposed in the tubular casing. The PCBA is secured to a plastic sliding rack structure that is disposed in the tubular casing and includes an actuating button protruding through a slot formed in a wall of the tubular casing. When the actuating button is manually pushed and slid along the slot, a portion of the sliding rack structure slides against the plastic sleeve portion in deploying and retracting the USB connector out of the device.

20 Claims, 34 Drawing Sheets

U.S. PATENT DOCUMENTS

| | | | |
|---|---|---|---|
| 5,430,859 A | 7/1995 | Norman et al. | |
| 5,479,638 A | 12/1995 | Assar et al. | |
| 5,623,552 A | 4/1997 | Lane | |
| 5,797,771 A | 8/1998 | Garside | |
| 5,835,760 A | 11/1998 | Harmer | |
| 5,859,766 A | 1/1999 | Van Scyoc et al. | |
| 5,899,773 A | 5/1999 | Cheng | |
| 5,907,856 A | 5/1999 | Estakhri et al. | |
| 5,959,541 A | 9/1999 | DiMaria et al. | |
| 5,984,731 A | 11/1999 | Laity | |
| 6,000,006 A | 12/1999 | Bruce et al. | |
| 6,012,636 A | 1/2000 | Smith | |
| 6,044,428 A | 3/2000 | Rayabhari | |
| 6,069,920 A | 5/2000 | Schulz et al. | |
| 6,069,970 A | 5/2000 | Salatino et al. | |
| 6,081,858 A | 6/2000 | Abudayyeh et al. | |
| 6,125,192 A | 9/2000 | Bjorn et al. | |
| 6,132,243 A | 10/2000 | Hirata et al. | |
| 6,148,354 A | 11/2000 | Ban et al. | |
| 6,159,039 A | 12/2000 | Wu | |
| 6,193,152 B1 | 2/2001 | Fernando et al. | |
| 6,202,138 B1 | 3/2001 | Estakhri et al. | |
| 6,230,233 B1 | 5/2001 | Lofgren et al. | |
| 6,275,894 B1 | 8/2001 | Kuo et al. | |
| 6,279,955 B1 | 8/2001 | Fisher | |
| 6,292,863 B1 | 9/2001 | Terasaki et al. | |
| 6,321,478 B1 | 11/2001 | Klebes | |
| 6,334,793 B1 | 1/2002 | Amoni et al. | |
| 6,438,638 B1 | 8/2002 | Jones et al. | |
| 6,456,500 B1 | 9/2002 | Chen | |
| 6,480,390 B2 | 11/2002 | Matsumiya et al. | |
| 6,547,130 B1 | 4/2003 | Shen | |
| 6,554,648 B2 | 4/2003 | Shi et al. | |
| 6,567,273 B1 | 5/2003 | Liu et al. | |
| 6,615,404 B1 | 9/2003 | Garfunkel et al. | |
| 6,618,243 B1 | 9/2003 | Tirosh | |
| 6,636,929 B1 | 10/2003 | Frentz et al. | |
| 6,676,419 B1 | 1/2004 | Lin et al. | |
| 6,717,817 B2 * | 4/2004 | Liu et al. | 361/737 |
| 6,718,407 B2 | 4/2004 | Martwick | |
| 6,737,591 B1 | 5/2004 | Lapstun et al. | |
| 6,743,030 B2 | 6/2004 | Lin et al. | |
| 6,763,410 B2 | 7/2004 | Yu | |
| D494,969 S | 8/2004 | Lin | |
| 6,778,401 B1 | 8/2004 | Yu et al. | |
| 6,792,487 B2 | 9/2004 | Kao | |
| 6,808,400 B2 | 10/2004 | Tu | |
| 6,854,984 B1 | 2/2005 | Lee et al. | |
| 6,880,024 B2 | 4/2005 | Chen et al. | |
| 6,999,322 B1 | 2/2006 | Lin | |
| 7,004,780 B1 | 2/2006 | Wang | |
| 7,021,971 B2 | 4/2006 | Chou et al. | |
| 7,044,802 B2 | 5/2006 | Chiou et al. | |
| 7,069,370 B2 | 6/2006 | Sukegawa et al. | |
| 7,074,052 B1 | 7/2006 | Ni et al. | |
| 7,090,541 B1 | 8/2006 | Ho | |
| 7,092,256 B1 | 8/2006 | Salazar et al. | |
| 7,097,472 B2 | 8/2006 | Parker | |
| 7,103,684 B2 | 9/2006 | Chen et al. | |
| 7,103,765 B2 | 9/2006 | Chen | |
| 7,104,848 B1 | 9/2006 | Chou et al. | |
| 7,125,287 B1 | 10/2006 | Chou et al. | |
| 7,155,545 B1 | 12/2006 | Wang | |
| 7,182,646 B1 | 2/2007 | Chou et al. | |
| 7,214,075 B2 | 5/2007 | He et al. | |
| 7,249,978 B1 | 7/2007 | Ni | |
| 7,257,714 B1 | 8/2007 | Shen | |
| 7,259,967 B2 * | 8/2007 | Ni | 361/760 |
| 7,264,992 B2 | 9/2007 | Hsueh et al. | |
| 7,269,004 B1 | 9/2007 | Ni et al. | |
| 7,287,705 B2 | 10/2007 | Tang | |
| 7,359,208 B2 * | 4/2008 | Ni | 361/752 |
| 7,361,059 B2 | 4/2008 | Harkabi et al. | |
| 7,366,028 B2 | 4/2008 | Kagan et al. | |
| 7,376,011 B2 | 5/2008 | Conley et al. | |
| 7,386,655 B2 | 6/2008 | Gorobets et al. | |
| 7,389,397 B2 | 6/2008 | Paley et al. | |
| 7,395,384 B2 | 7/2008 | Sinclair et al. | |
| 7,524,198 B2 | 4/2009 | Nguyen et al. | |
| 7,540,786 B1 * | 6/2009 | Koser et al. | 439/660 |
| 7,581,967 B2 | 9/2009 | Collantes, Jr. et al. | |
| 2001/0043174 A1 | 11/2001 | Jacobsen et al. | |
| 2002/0036922 A1 | 3/2002 | Roohparvar | |
| 2002/0166023 A1 | 11/2002 | Nolan et al. | |
| 2003/0046510 A1 | 3/2003 | North | |
| 2003/0100203 A1 | 5/2003 | Yen | |
| 2003/0163656 A1 | 8/2003 | Ganton | |
| 2003/0177300 A1 | 9/2003 | Lee et al. | |
| 2003/0182528 A1 | 9/2003 | Ajiro | |
| 2004/0034765 A1 | 2/2004 | James | |
| 2004/0148482 A1 | 7/2004 | Grundy et al. | |
| 2004/0153595 A1 | 8/2004 | Sukegawa et al. | |
| 2004/0255054 A1 | 12/2004 | Pua et al. | |
| 2005/0009388 A1 | 1/2005 | Chao | |
| 2005/0085133 A1 | 4/2005 | Wang et al. | |
| 2005/0102444 A1 | 5/2005 | Cruz | |
| 2005/0114587 A1 | 5/2005 | Chou et al. | |
| 2005/0120146 A1 | 6/2005 | Chen et al. | |
| 2005/0160213 A1 | 7/2005 | Chen | |
| 2005/0182858 A1 | 8/2005 | Lo et al. | |
| 2005/0193161 A1 | 9/2005 | Lee et al. | |
| 2005/0193162 A1 | 9/2005 | Chou et al. | |
| 2005/0216624 A1 | 9/2005 | Deng et al. | |
| 2005/0223158 A1 | 10/2005 | See et al. | |
| 2005/0246243 A1 | 11/2005 | Adams et al. | |
| 2005/0268082 A1 | 12/2005 | Poisner | |
| 2005/0271458 A1 | 12/2005 | Kui | |
| 2006/0065743 A1 | 3/2006 | Fruhauf | |
| 2006/0075174 A1 | 4/2006 | Vuong | |
| 2006/0106962 A1 | 5/2006 | Woodbridge et al. | |
| 2006/0161725 A1 | 7/2006 | Lee et al. | |
| 2006/0184709 A1 | 8/2006 | Sukegawa et al. | |
| 2006/0206702 A1 | 9/2006 | Fausak | |
| 2006/0234533 A1 | 10/2006 | Lei et al. | |
| 2006/0242395 A1 | 10/2006 | Fausak | |
| 2007/0079043 A1 | 4/2007 | Yu et al. | |
| 2007/0094489 A1 | 4/2007 | Ota et al. | |
| 2007/0113067 A1 | 5/2007 | Oh et al. | |
| 2007/0113267 A1 | 5/2007 | Iwanski et al. | |
| 2007/0130436 A1 | 6/2007 | Shen | |
| 2008/0232060 A1 | 9/2008 | Yu et al. | |

FOREIGN PATENT DOCUMENTS

| | | |
|---|---|---|
| JP | 02-118790 A | 5/1990 |
| JP | 11-039483 | 2/1999 |

* cited by examiner

Data structure of PLTPPUI in Reserved Area of MLC Flash Memory 420

Old physical block (PBK#1000) for storing PLTPPUI0 422

| | 427 | 442 | 446 |
|---|---|---|---|
| 1st Write (P0) 424a | Entry 0 | Entry 1 | FF | Special Logical Address for PLTPPUI0 | 1 |
| 2nd Write (P1) 424b | Entry 0 | Entry 1 | | | |
| ** | | | | | |
| nth Write (Pn) 424n | Entry 0 | Entry 1 | | | |

{ 425 }  { 426 }

New physical block (PBK#1012) for storing PLTPPUI0 432

| (n+1)th Write (P0) 434 | Entry 0 | Entry 1 | ** | FF | Special Logical Address for PLTPPUI0 | 2 |
|---|---|---|---|---|---|---|
| | | | | | | |
| | | | | | | |
| | | | | | | |

*FIG. 4C*

Data Structure of the PLTPPUI Tracking Table 440

| | | Physical Block Number 444 | Tracking No. (TN) 446 | Highest Page 448 |
|---|---|---|---|---|
| 442 { | Special Logical Address for PLTPPUI0 | 1012 | 0 | 0 |
| | Special Logical Address for PLTPPUI1 | 1018 | 5 | 1 |
| | ⋮ | | | |
| | Special Logical Address for PLTPPUIN | 1005 | 4 | 0 |

*FIG. 4D*

Data Structure of the WL/BB Tracking Table 450

| | | Physical Block Number 454 | Tracking No. (TN) 456 | Highest Page 458 |
|---|---|---|---|---|
| 452 { | Special Logical Address for WL/BB0 | 1023 | 1 | 5 |
| | Special Logical Address for WL/BB1 | 1020 | 0 | 3 |
| | ⋮ | | | |
| | Special Logical Address for WL/BBn | 1021 | 3 | 7 |

*FIG. 4E*

Data Structure of the WL/BB Tracking Table in Reserved Area of Flash Memory 460

|  | BK0 (reserved) | BK1 WL |  |  |  |  | 467 | 452 | 456 | 1 |
|---|---|---|---|---|---|---|---|---|---|---|
| 1st White (P0) | | | | | | | | Special Logical Address for WL/BB1 | |
| 2nd White (P1) | | BK1 WL old | BK3 WL new | | | BK7 BB FFFF FFEE | F | F | | |
| 3rd White (P2) | | BK1 WL old | BK3 WL old | BK5 WL new | | | | | | |
| • | | | | | | | | | | |
| • | | | | | | | | | | |
| nth White (Pn) | | | | | | | BK 1000 WL new | | | |

| | | | | | | | | 1 |
|---|---|---|---|---|---|---|---|---|
| 1st White (P0) | BK 1000 WL new | | | | | | Special Logical Address for WL/BB2 | |
| 2nd White (P1) | BK 1000 WL old | BK 1003 BB | | | BK 1021 WL new | | F F | |
| • | | | | | | | | |
| • | | | | | | | | |
| nth White (Pn) | | | | | | | | |

*FIG. 4F*

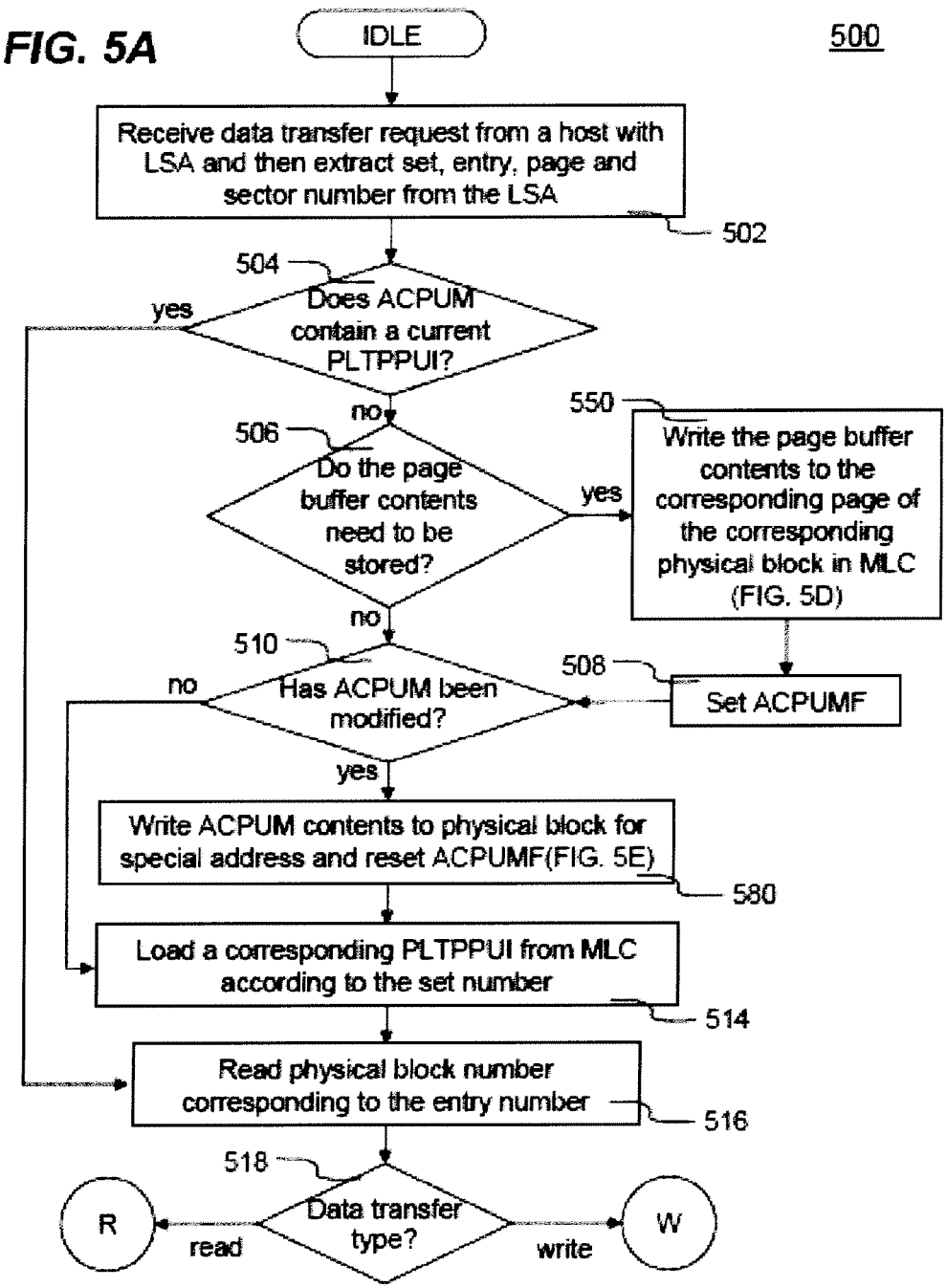

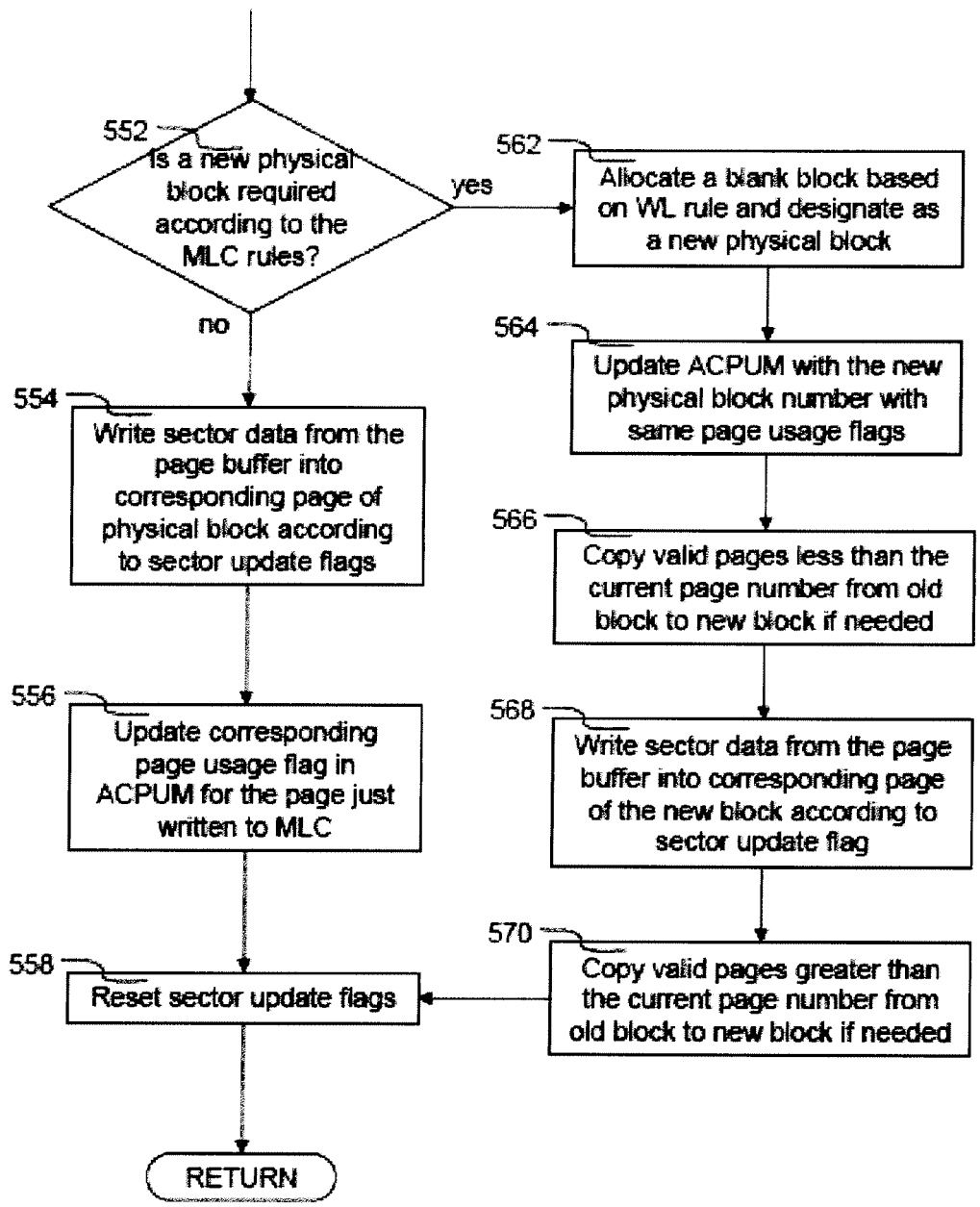

PRESS-PUSH FLASH DRIVE APPARATUS WITH METAL TUBULAR CASING AND SNAP-COUPLED PLASTIC SLEEVE

RELATED APPLICATIONS

This application is continuation-in-part of U.S. patent application for "FLASH DRIVE WITH SPRING-LOADED RETRACTABLE CONNECTOR", U.S. application Ser. No. 12/361,772, filed on Jan. 29, 2009.

This application is also a (CIP) of co-pending U.S. patent application for "Methods and Systems of Managing Memory Addresses in a Large Capacity Multi-Level Cell (MLC) based flash memory device", Ser. No. 12/025,706, filed Feb. 4, 2008.

This application is also a (CIP) of co-pending U.S. patent application for "Press/Push USB Flash Drive with Deploying and Retracting Functionalities with Elasticity Material and Fingerprint Verification Capability", Ser. No. 11/845,747, filed Aug. 27, 2007.

This application is also a CIP of co-pending U.S. patent application for "Slide Flash Memory Device", Ser. No. 12/604,309, filed Oct. 22, 2009.

This application is a CIP of co-pending U.S. patent application for "MLC COB USB Flash Memory Device with Sliding Plug Connector", Ser. No. 12/171,194, filed Jul. 10, 2008.

This application relates to U.S. Pat. No. 7,004,780, filed on May 13, 2004, and entitled "PORTABLE COMPUTER PERIPHERAL APPARATUS WITH RETRACTABLE PLUG CONNECTOR".

BACKGROUND OF THE INVENTION

1. Field of the Invention

The invention relates to flash memory devices, more particularly to systems and methods of managing memory addresses in a large capacity multi-level cell (MLC) based flash memory device housed in a tubular casing.

2. Description of the Related Art

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity. As such, a problem arises when mobile systems that are designed for one type of flash memory are constructed using another, incompatible type of flash memory.

New generation personal computer (PC) card technologies have been developed that combine flash memory with architecture that is compatible with the Universal Serial Bus (USB) standard. This has further fueled the flash memory trend because the USB standard is easy to implement and is popular with PC users. In addition, flash memory is replacing floppy disks because flash memory provides higher storage capacity and faster access speeds than floppy drives.

In addition to the limitations introduced by the USB standard, there are inherent limitations with flash memory. First, flash memory sectors that have already been programmed must be erased before being reprogrammed. Also, flash memory sectors have a limited life span; i.e., they can be erased only a limited number of times before failure. Accordingly, flash memory access is slow due to the erase-before-write nature and ongoing erasing will damage the flash memory sectors over time.

To address the speed problems with USB-standard flash memory, hardware and firmware utilize existing small computer systems interface (SCSI) protocols so that flash memory can function as mass-storage devices similarly to magnetic hard disks. SCSI protocols have been used in USB-standard mass-storage devices long before flash memory devices have been widely adopted as storage media. Accordingly, the USB standard has incorporated traditional SCSI protocols to manage flash memory.

As the demands for larger capacity storage increase, the flash memory device needs to keep up. Instead of using single-level cell flash memory, which stores one-bit of information per cell, multi-level cell (MLC) flash memory, or hybrid flash memory, which is assembled partially SLC and partially MLC, is used. The MLC flash memory allows at least two bits per cell. However, there are a number of problems associated with the MLC flash memory. First, the MLC flash memory has a low reliability. Secondly, the MLC flash memory data programming rules require writing to an ascending page in the same block or writing to a blank new page if there are data existed in the original page. Finally, a larger capacity requires a large logical-to-physical address look up table. In the prior art approach, the size look up table is in direct portion with the capacity of the flash memory. This creates a huge problem not only to the cost, but also to the physical size of the flash memory device. Furthermore, the traditional usage of the flash memory devices is generally in a very clean and relatively mild environment, thus the packaging design such as enclosure of the flash memory device is not suitable for hostile environment such as military and heavy industrial applications.

Modern portable computer peripheral devices for storing confidential data take many mechanical forms. In most cases, such peripheral devices have been reduced to "pocket size", meaning that they can literally be carried in a user's pocket in the same manner as a wallet or set of keys. One example of particular interest is a pen-type flash device having a USB connector plug that can be connected to a USB port of a standard computer. The USB plug connector is protected by a removable cap when not in use. A problem with convention pen-type peripheral devices is that the removable cap can become inadvertently lost while the device is in use, thereby leaving the USB plug connector exposed to damage or contamination.

An alternative to conventional pen-type peripheral devices is a "press-push" memory device, which provides a connector that retracts into a housing of the memory device for protection when not in use. A device with a retractable connector generally has a button feature on the outside of its housing that allows a user to manually slide the connector between a retracted position and an extended (deployed) position. In the extended position, the connector extends through an opening in the housing so that it may be plugged into a receptacle. In the retracted position, the connector is contained within the housing and is protected by the housing, thereby obviating the need for a separate cap that can be lost.

Although "press-push" memory devices avoid the problems of conventional pen-type peripheral devices, e.g., by avoiding the need for a separate cap, the molded plastic housing typically used for these devices can be easily crushed when the device is accidentally dropped or subjected to a blunt impact force, leading to undesirable resistance or jamming that prevents the desired retraction of the connector when not in use.

To address the strength/durability issues associated with conventional all-plastic "press-push" memory devices, many recently produced "press-push" memory devices are made with durable metal tubular casings. The metal tubular casing houses a plastic "press-push" mechanism that supports the PCBA and is movable inside the metal tubular casing to deploy or retract a USB plug connector. In addition to providing durability, metal tubular casings also help with heat dissipation, which is particularly important in newer USB 3.0 flash drives that can consume more power (generates more heat) than USB 2.0 flash drives (the current usage for USB 2.0 is rated up to 500 mA compared to 950 mA of USB 3.0; therefore, the maximum power consumption of USB 2.0 is 2.5 W (500 mA×5V) compared to 4.75 W of USB 3.0). The bus power 5V is supplied by the USB computer host.

Although using metal tubular casings to produce durable "press-push" memory devices addresses the durability and heat dissipation issues associated with conventional all-plastic "press-push" memory devices, the metal tubular casings introduce a new set of problems.

One problem with "press-push" memory devices made with metal tubular casing is that the use of different housing materials (i.e., metal and plastic) complicates the manufacturing process due to the different manufacturing techniques that are required, which can result in mismatched structures that fail to connect properly, leading to defective devices that fall apart prematurely fail to operate properly, leading to undesirable resistance or jamming that prevents the desired retraction of the connector when not in use.

Another problem associated with such "press-push" memory devices is that the metal tubular casing is much harder than the plastic "press-push" mechanism, causing accelerated wear of the plastic mechanism, leading to undesirable resistance or jamming that prevents the desired retraction of the connector when not in use.

Therefore, it would be desirable to have improved methods and systems of managing memory addresses in a large capacity multi-level cell (MLC) flash memory device. What is also needed is a retractable portable computer peripheral apparatus for housing a large capacity multi-level cell (MLC) flash memory device that overcomes the problems associated with conventional press-push memory devices housed in metal tubular casings.

SUMMARY OF THE INVENTION

Methods and systems of managing memory addresses in a large capacity multi-level cell (MLC) based flash memory device are disclosed. According to one aspect of the present invention, a MLC based flash memory device comprises a card body with a processing unit, an input/output (I/O) circuit and at least one MLC flash memory chip mounted thereon. The card body may comprise a print circuit board (PCB). The I/O circuits generally are coupled to the processing unit in form of an integrated circuit. The processing unit manages data transfers between a host computing device (e.g., personal computer, consumer electronic device) and the at least one flash memory chip. The MLC based flash memory chip is configured to provide data storage for the host.

According to an aspect of the present invention, a press-push flash drive device includes a housing formed by a tubular casing and a plastic housing assembly, and a carrier assembly that is selectively movably disposed in an inner chamber of the housing to move a plug connector between a deployed and retracted position. The tubular casing includes an integral tubular (e.g., box-like) wall surrounding an inner chamber, the tubular wall having a front end portion defining a front (first) opening, a rear end portion defining a rear (second) opening, and an elongated actuating (third) opening defined in the tubular wall between the first and second end portions. Because the tubular casing includes an integral structure (e.g., single-piece molded or machined from a single block of metal or other hard material), the tubular casing provides durable and reliable protection for the electronic components disposed in the housing of the device. The plastic housing assembly includes a front (first) cap portion fixedly connected over the front end portion of the tubular casing, a rear (second) cap portion fixedly connected over the rear end portion of the tubular casing, and a sleeve portion disposed in the inner chamber of the tubular casing between the front cap portion and the rear cap portion. Because the plastic housing assembly includes cap portions that are respectively disposed over the opposing front and rear ends of the tubular casing and includes a portion that extends entirely through the metal tube casing between the cap portions, the present invention addresses the manufacturing problems associated with the use of plastic and metal by providing for minor defects in the tubular casing size, and also prevents cuts or other injury that can occur if the metal tubular casing includes burrs or other defects along its front or rear edges. The carrier assembly includes a PCBA that is fixedly connected to a plastic positioning member including an actuating button that protrudes through the actuating opening of the tubular casing. The PCBA positioning member is fixedly connected to the PCBA and restricted to slide in the inner chamber such that manual movement of actuating button along the actuating opening causes the plug connector to move between a deployed (first) position and a retracted (second) position. According to another aspect of the invention, the positioning member is disposed relative to the sleeve portion such that when the actuating button is manually pushed along the actuating opening during movement of the plug connector between the deployed and retracted positions, a portion of the positioning member slides against the sleeve portion, thereby avoiding the excessive wear and early failure that can occur when plastic slides directly on metal.

According to another aspect of the present invention, the plastic housing assembly includes a snap-coupling mechanism arranged such that, when the plastic housing assembly is mounted onto the tubular casing and the snap-coupling mechanism is operably engaged, the tubular casing is fixedly and rigidly held between the front and rear cap portions of the plastic housing assembly, and the sleeve portion is rigidly held in the inner chamber of the tubular casing between the front and rear cap portions. This arrangement greatly simplifies the assembly process and provides an aesthetically pleasing final product, thus providing both low cost and high customer appeal. In one specific embodiment, the snap-coupling mechanism is implemented by elongated pawls that are respectively formed on the front and rear cap portions, and corresponding locking grooves that are formed on an inside surface of the tubular casing, whereby the front and rear cap portions become snap-coupled when pressed onto the front and rear ends of the tubular casing, respectively, until the elongated pawls engage the corresponding locking grooves. In another specific embodiment, the snap-coupling mechanism is implemented solely by structures formed on the plastic housing assembly, wherein the sleeve portion is integrally connected to the front cap and includes locking grooves that receive locking pawls disposed on the rear cap portion during assembly.

According to another aspect of the present invention, a locking mechanism is provided for maintaining the plug connector in the retracted and deployed positions. In one embodiment the locking mechanism is formed by a lock tab integrally molded on the positioning member adjacent to the actuating button that is selectively manually engaged with a lock slots formed on the tubular casing adjacent to the actuating opening for securely maintaining the plug connector in the retracted and deployed positions. In one specific embodiment, a plastic side portion of the plastic housing assembly includes corresponding lock slots that receive the lock tabs in a manner that minimizes plastic-on-metal contact.

BRIEF DESCRIPTION OF THE DRAWING

Other features and advantages of the present invention will become apparent in the following detailed description of the preferred embodiment with reference to the accompanying drawings, of which:

FIGS. 4A-4F collectively show exemplary data structures used for managing memory addresses of the flash memory of FIG. 2A in accordance with one embodiment of the present invention;

FIGS. 5A-5E collectively show a flow chart of an exemplary process of conducting data transfer requests of the flash memory of FIG. 2A in accordance with one embodiment of the present invention;

DETAILED DESCRIPTION OF THE PREFERRED EMBODIMENT

The present invention relates to an improvement in flash memory devices such as USB flash drives. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
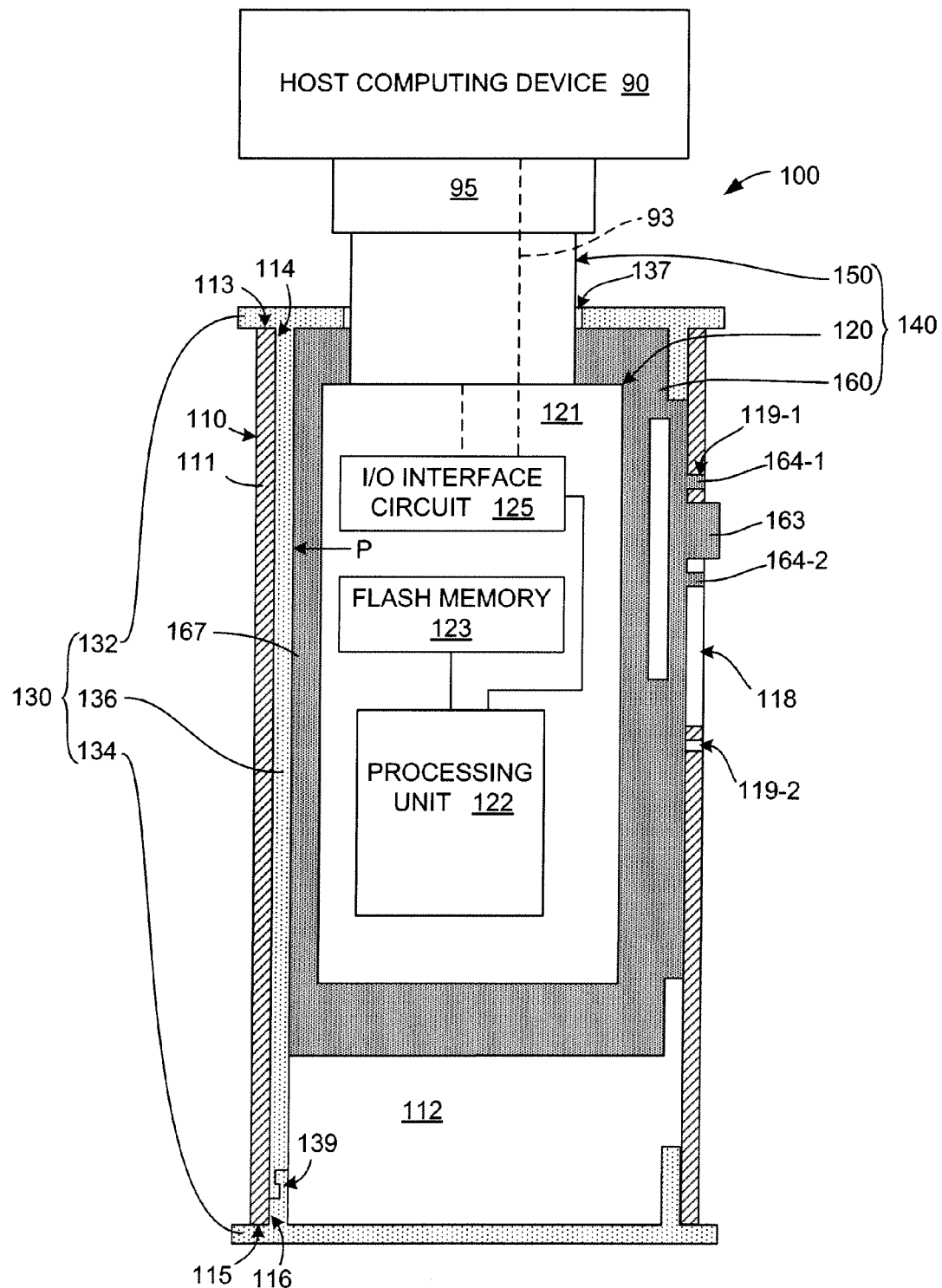
FIGS. 1(A) and 1(B) are simplified diagrams showing electronic apparatus representing simplified embodiments of the present invention.

FIG. 1(A) is a block diagram illustrating an electronic environment in which the present invention may be deployed in an exemplary electronic flash memory device. In particular, FIG. 1(A) is a simplified diagram showing a portable computer peripheral apparatus (e.g., a flash drive device) 100 according to a generalized embodiment of the present invention. Apparatus 100 is adapted to be accessed by an external computer 90, and is shown to include a printed circuit board assembly (PCBA) 120 including a card body 121, a processing unit 122, a memory device 123, and an input/output interface circuit 125.

Card body 121 is configured for providing electrical and mechanical connection for the processing unit 122, the flash memory module 123, the I/O interface circuit 125, and all of the optional components. Card body 121 may comprise a printed circuit board (PCB) or an equivalent substrate such that all of the components as integrated circuits may be mounted thereon. The substrate may be manufactured using surface mount technology (SMT) or chip on board (COB) technology.

Processing unit 122 and the I/O interface circuit 125 are collectively configured to provide various control functions (e.g., data read, write and erase transactions) of the flash memory module 123. Processing unit 122 may also be a standalone microprocessor or microcontroller, for example, an 8051, 8052, or 80286 Intel® microprocessor, or ARM®, MIPS® or other equivalent digital signal processor. Processing unit 122 and the I/O interface circuit 125 may be made in a single integrated circuit, for application specific integrated circuit (ASIC).

The at least one flash memory module 123 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof. Flash memory module 123 stores, in a known manner therein, one or more data files and an optional reference password. In one embodiment, only authorized users can access the stored data files. The data file can be a picture file, a text file or any other file.

Input/output interface circuit 125 is mounted on the card body 121, and can be activated so as to establish communication with the host computing device 90 by way of a socket 95 via an interface bus 93 that is established when a plug connector 150 attached to card body 121 is coupled with socket 95. Input/output interface circuit 125 may include circuits and control logic associated with a Universal Serial Bus (USB) interface structure that is connectable to an associated socket connected to or mounted on the host computing device 90.

Processing unit 122 is controlled by a software program module (e.g., a firmware (FW)), which may be stored partially in a ROM (not shown) such that processing unit 122 is operable selectively in: (1) a data programming or write mode, where processing unit 122 activates input/output interface circuit 125 to receive data from the host computing device 90 under the control of the host computing device 90, and store the data in the flash memory module 123; (2) a data retrieving or read mode, where the processing unit 122 activates the input/output interface circuit 125 to transmit data stored in the flash memory module 123 to the host computing device 90; or (3) a data resetting or erasing mode, where data in stale data blocks are erased or reset from the flash memory module 123. In operation, host computing device 90 sends write and read data transfer requests to flash memory device 100 via the interface bus 93, then input/output interface circuit 125 to the processing unit 122, which in turn utilizes a flash memory controller (not shown or embedded in the processing unit) to read from or write to the associated at least one flash memory module 123. In one embodiment, for further security protection, the processing unit 122 automatically initiates an operation of the data resetting mode upon detecting a predefined time period has elapsed since the last authorized access of the data stored in flash memory module 123.

Figure 2A:
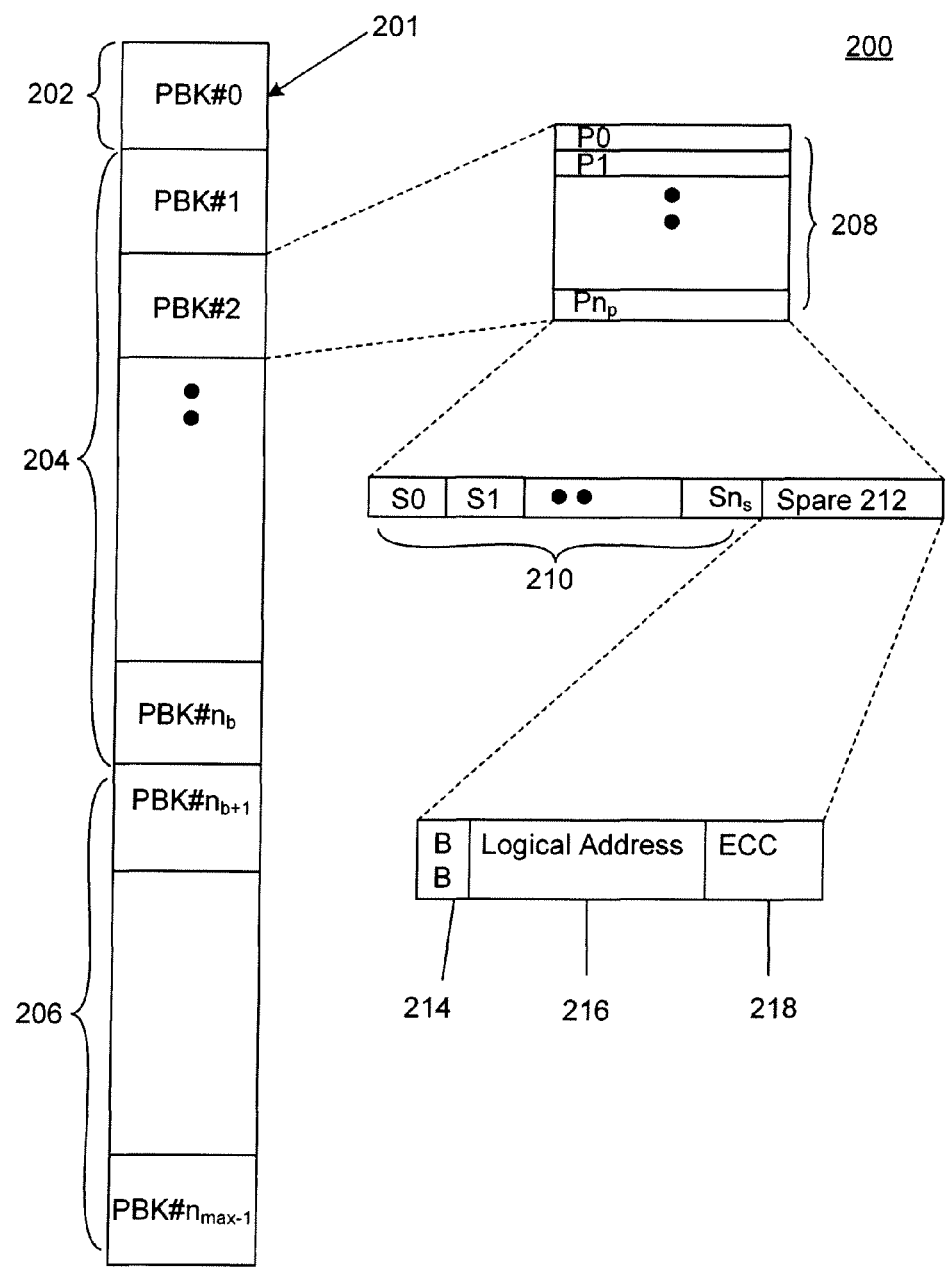
FIG. 2A is a diagram depicting a data structure of an exemplary large capacity flash memory, according to one embodiment of the present invention.

Referring now to FIG. 2A, which is a diagram depicting an exemplary data structure 200 of a flash memory module 201 (e.g., flash memory module 123 of FIG. 1(A)) in accordance with one embodiment of the present invention. The flash memory module 201 is divided into a plurality of physical blocks e.g., PBK#0, PBK#1, PBK#2, In general, there are three categories of physical blocks: 1) the first block 202 (i.e., PBK#0); 2) normal usage data blocks 204 (i.e., PBK#1, PBK#2,. . . , PBK#$n_b$); and 3) reserved blocks 206 (i.e., PBK#$n_{b+1}$, . . . PBK#$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK#1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Figure 4A:
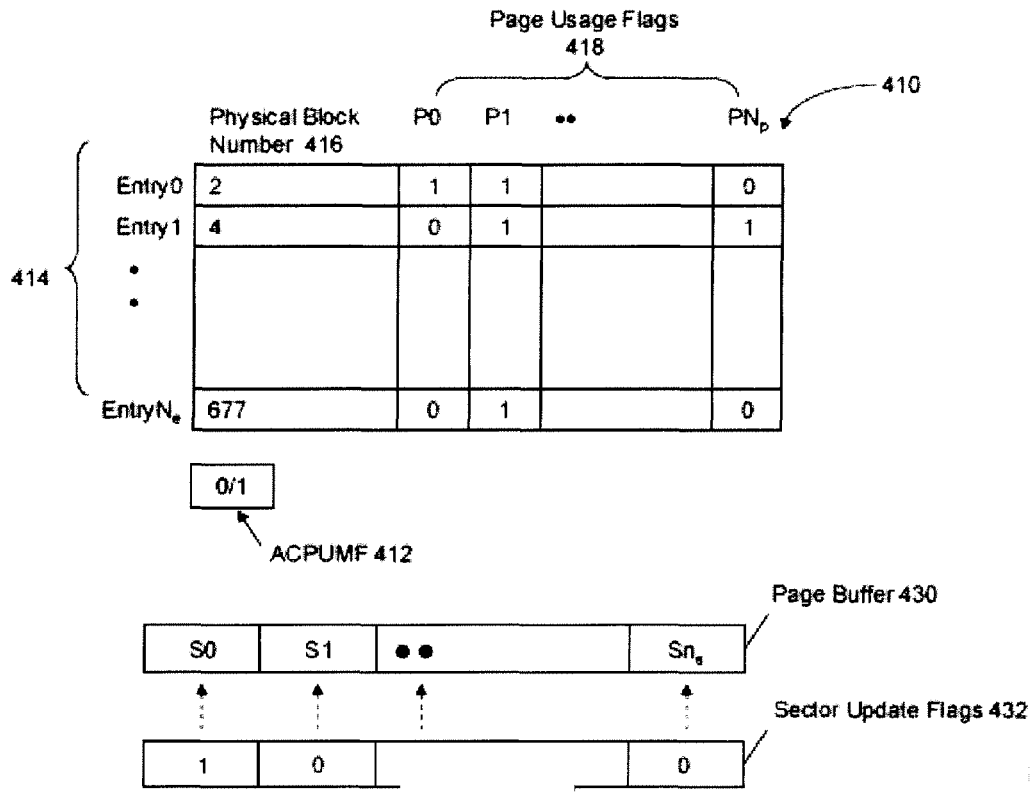
Figure 4B:
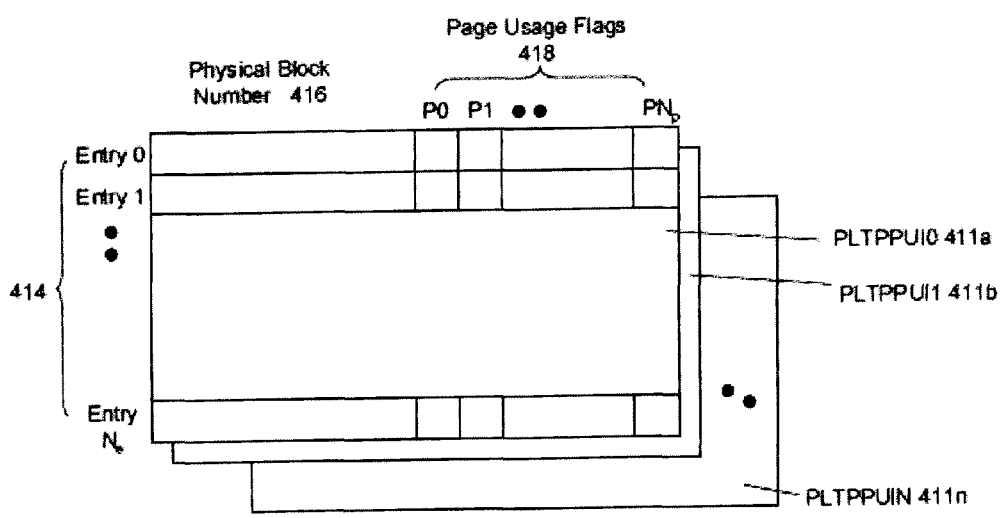

Each block is further divided into a plurality of pages 208 (e.g., P0, P1, . . . , P$n_p$). Each of the pages 208 includes a data area 210 and a spare area 212. The data area is partitioned into a plurality of sectors (e.g., S0, S1, S$n_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the flash memory device. More details are described in FIG. 4E and FIG. 4F for the reserved physical blocks as used by an embodiment of the present invention. Detailed processes of initialization are shown in FIGS. 7A-7E. The ECC area 218 is configured to store the ECC for ensuring data integrity.

In order to access the data stored in the normal usage blocks 204 of the flash memory module 201, the host computing device 90 transmits a data transaction request (e.g., data read or write) along with a logical sector address (LSA) to the flash memory device. The processing unit 102 of the flash memory device converts the received LSA into a physical address (i.e., specific block, page and sector numbers) before any data transaction can be performed. Traditionally, the conversion is performed by an address look up table with a one-to-one relationship to the physical address. This solution works for a flash memory device with relatively small capacity, because the address look up table is implemented with a static random access memory (SRAM). It would not be feasible in terms of cost and physical space to include SRAM that grows linearly as the capacity of the flash memory device especially for a large capacity MLC based flash memory device. For example, a large capacity (say 32 Giga-Byte (GB)) MLC based flash memory device using 2112-byte page (i.e., 2048-byte data plus 64-byte spare) and 128 pages per block, it would require more than 2 MB bytes of SRAM to hold the entire address look up table.

Figure 2B:
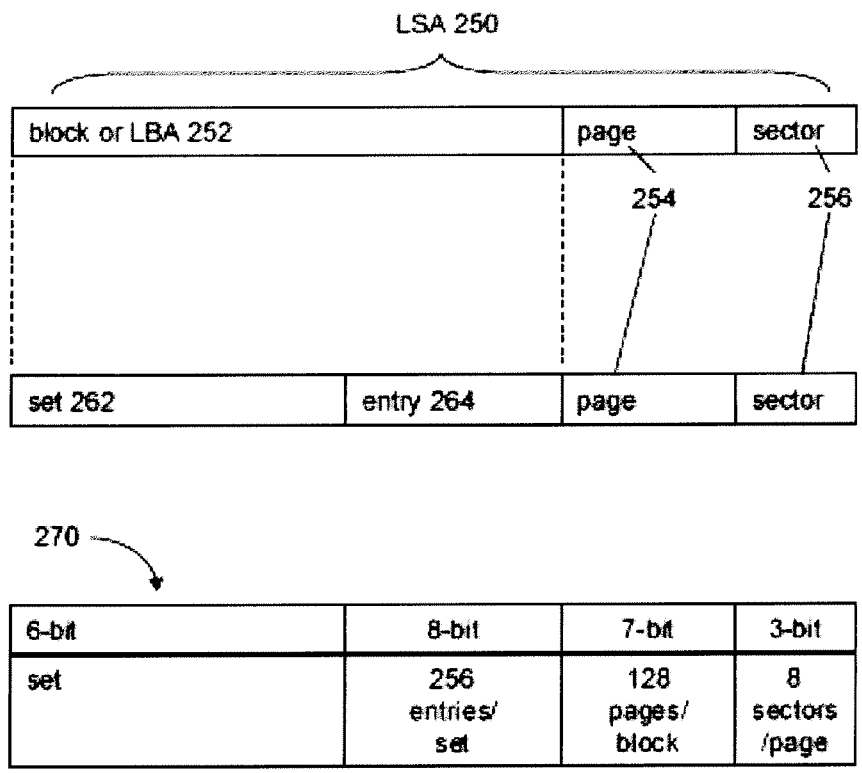
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK#0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', 'PLTPPUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK#) in the flash memory device. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 3:
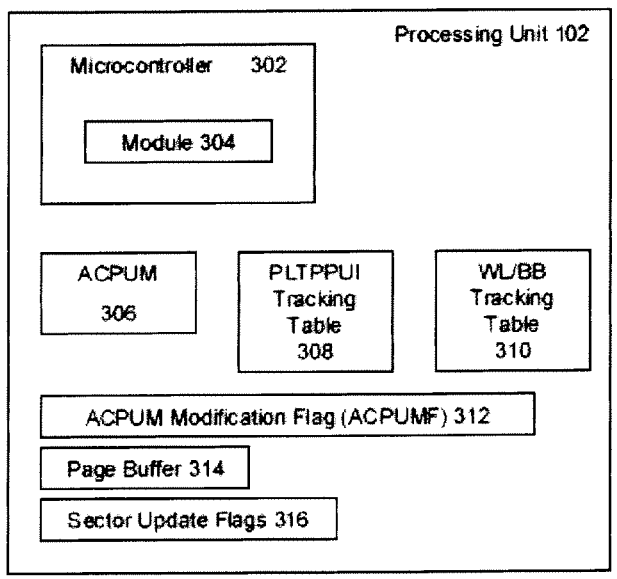
FIG. 3 is a simplified block diagram illustrating salient components of an exemplary processing unit of each of the electronic flash memory devices of FIGS. 1(A) and 1(B), according to an embodiment of the present invention.

FIG. 3 is a simplified block diagram showing salient components of the process unit 102 of an electronic flash memory device in accordance with one embodiment of the present invention. The processing unit 102 comprises a microcontroller or microprocessor 302, an address correlation and page usage memory (ACPUM) 306, a PLTPPUI tracking table 308, a wear leveling and bad block (WL/BB) tracking table 310, a ACPUM modification flag (ACPUMF) 312, a page buffer 314 and a set of sector update flags 316.

The microcontroller 302 with a flash memory controlling program module 304 (e.g., a firmware (FW)) installed thereon is configured to control the data transfer between the host computing device 109 and the at least one flash memory module 103. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK#) 416 and a plurality of page usage flags 418 associated with the PBK#. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, . . . , $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK#1000' 422 initially. Due to the MLC flash memory data programming rules, each page can only be programmed or written once (i.e., NOP=1) and data programming within one block can only be in a ascending page order. The second data programming or write can only be into the second page (P1) 424b until the $n^{th}$ write to the last page (Pn) 424n of the block 'PBK#1000' 422. After that, the next data programming, the $(n+1)^{th}$ write, must be written to the first page (P0) 434 of a new physical block (PBK#1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFF0'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures and examples shown in FIGS. 6A-6D. The process 500 is performed by the microcontroller 302 with a flash memory controller program module 304 installed thereon.

The process 500 starts in an 'IDLE' state until the microcontroller 302 receives a data transfer request from a host (e.g., the host computing device 90 of FIG. 1(A)) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK#) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which, the process 500 writes the contents of the ACPUM 306 to one of a plurality of first special logical addresses (e.g., '0xFFFF0000' for PLTPPUI0, or '0xFFFF0001' for PLTP- PUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5B:
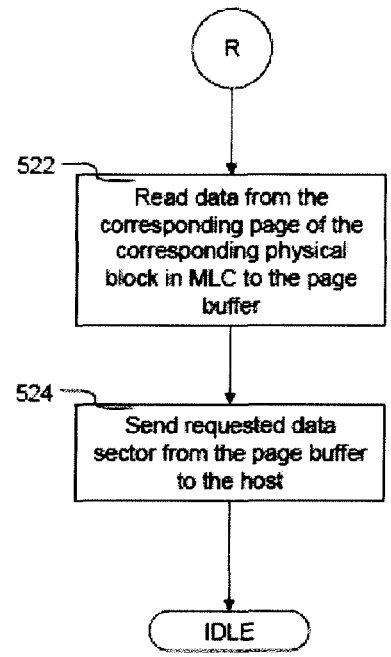

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

Figure 5C:
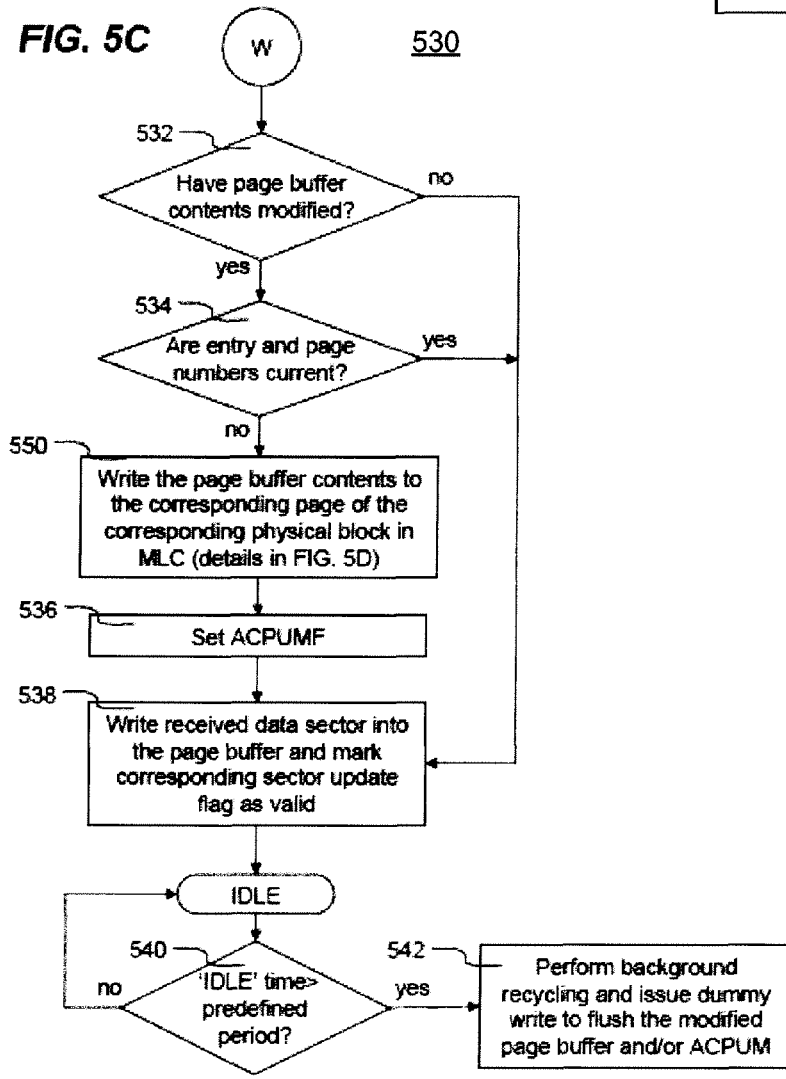

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/program command may be issued to rewrite some of seldom touched physical blocks, for example, physical blocks used for storing user application or system program modules.

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

Figure 5E:
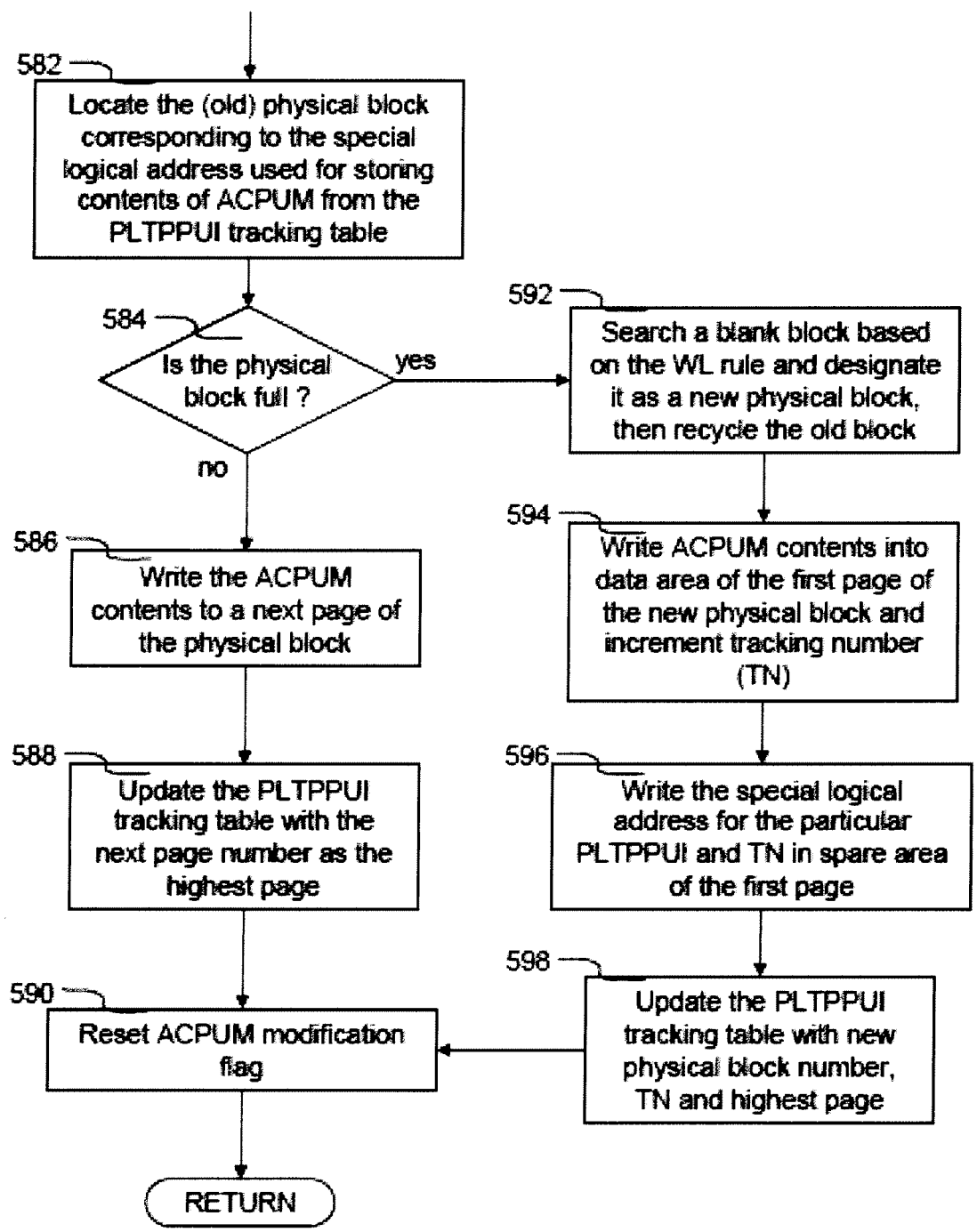

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLTPPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK#1012) in FIG. 4C) in the reserved area of the flash memory based on the WL rule, and the old physical block (e.g., old physical block (PBK#1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process 500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

FIGS. 6A-6D collectively show a sequence of data write or program requests to demonstrate the exemplary process 500 of FIGS. 5A-5E. In order to simplify the drawings and description, the sequence of the data write requests is perform on an exemplary flash memory with four sectors per page, four pages per block, and four entries per set. As a result of the simplified assumption, the logical sector address (LSA) 602 received along with the data write request can be processed in a scheme corresponding to Table 1. In other words, two least significant bits of the LSA represent the sector number, next two the page number, next two the entry number, and the remaining bits the set number.

The sequence of the data write requests starts with (a) writing to LSA=0, which corresponds to set 0 (i.e., PLTP-PUI0), entry 0, page 0 and sector 0. PLTPPUI0 is loaded into ACUPUM 604, in which the first entry (i.e., entry 0) corresponds to physical block 'PBK#2' and page usage flags 606 are not set. The ACPUMF 614 is set to a 'un-modified' status. The sector data (S0) is written to the first sector of the page buffer 610 and the corresponding flag in the sector update flags 612 is set to a 'V' for valid data. The corresponding path in the process 500 for writing LSA=0 is as follows:

(1) receiving an LSA=0 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (no);
(6) writing received data sector (S0) into the page buffer and marking corresponding sector ($1^{st}$) update flag at 538; and
(7) going back to 'IDLE' for next data transfer request.

The next data write request (b) is to write to LSA=1. The corresponding path is the process 500 is as follows:

(1) receiving an LSA=1 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (yes);
(7) writing received data sector (S1) into page buffer and marking corresponding sector ($2^{nd}$) update flag at 538; and
(8) going back to 'IDLE' for next data transfer request.

Figure 6A:
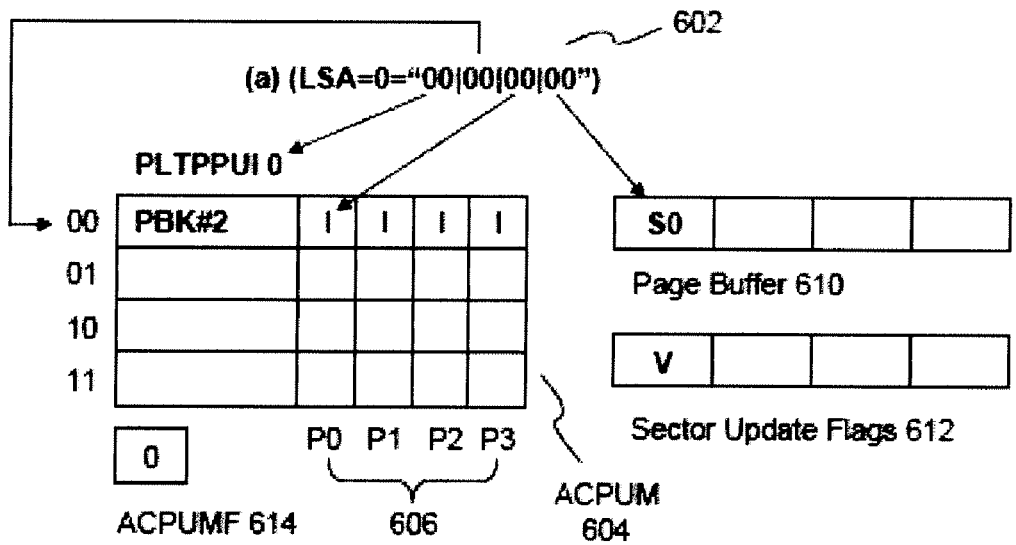
FIGS. 6A-6E collectively show a sequence of data write requests to demonstrate the exemplary process 500 of FIGS. 5A-5E.
Figure 6A:
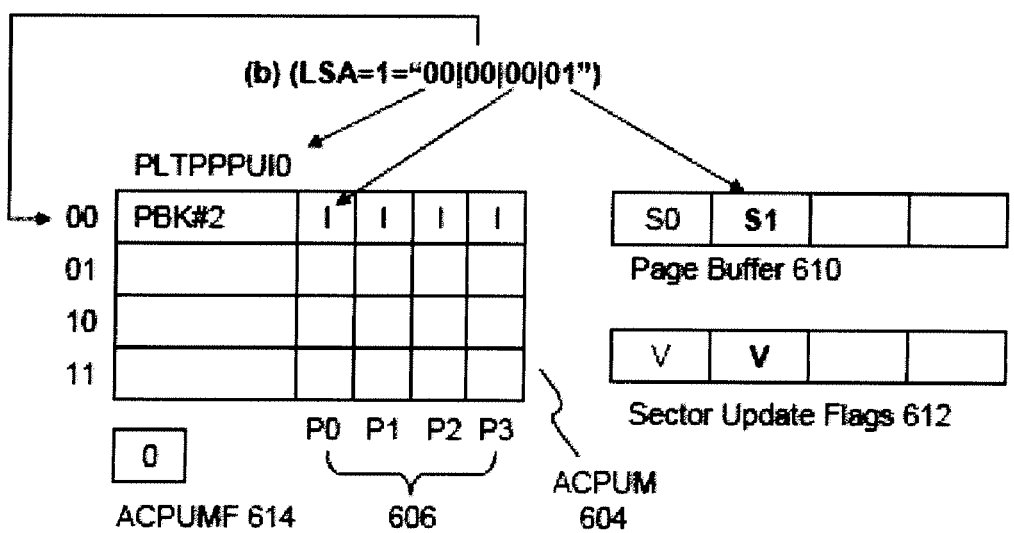
Figure 6B:
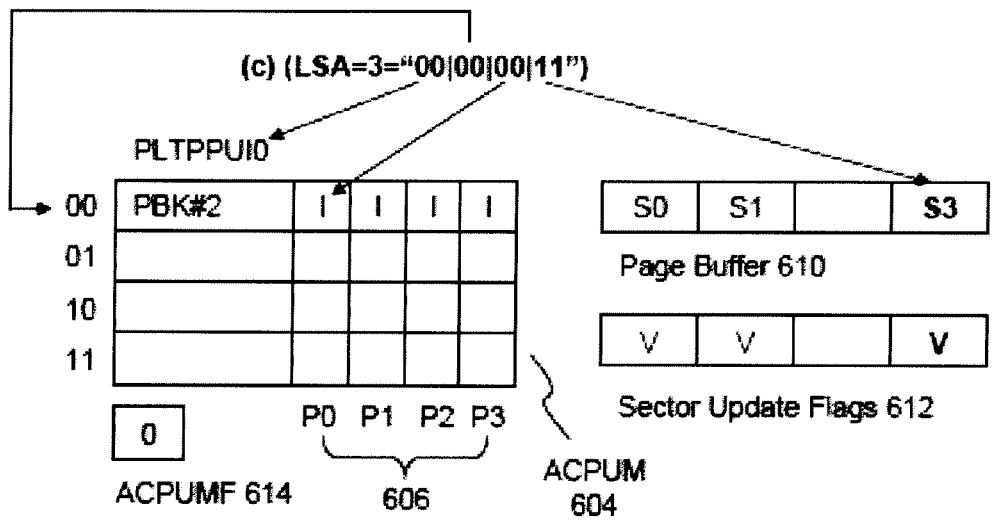
Figure 6B:
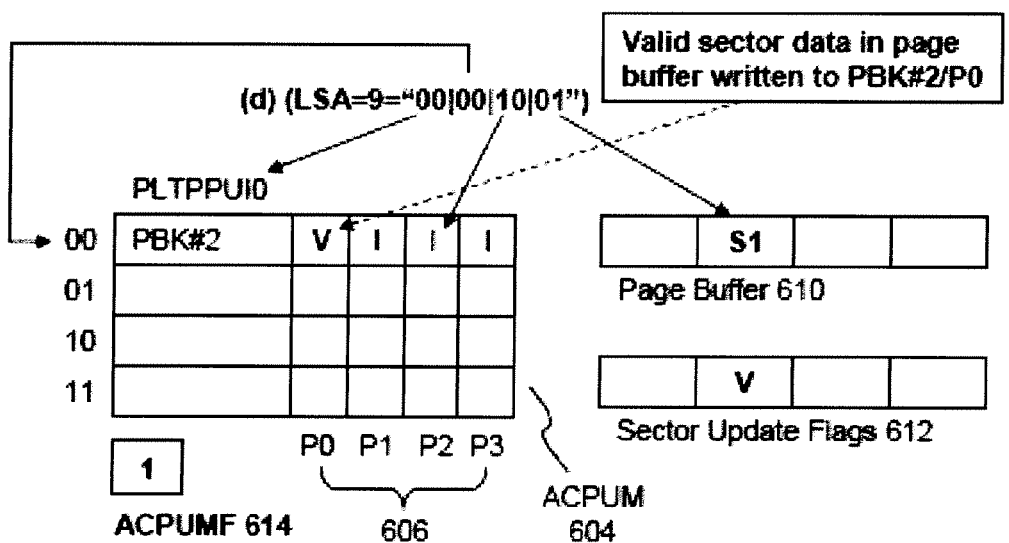

The next data write request (c) is to write to LSA=3 (FIG. 6B). The corresponding path is the process 500 is as follows:

(1) receiving an LSA=3 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (yes);
(7) writing received data sector (S3) into the page buffer and marking corresponding sector ($4^{th}$) update flag at 538; and
(8) going back to 'IDLE' for next data transfer request.

The next data write request (d) is to write to LSA=9 (FIG. 6B). The corresponding path is the process 500 is as follows:

(1) receiving an LSA=9 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (no, same block but different page);
(7) writing the page buffer contents to the corresponding page (first page of PBK#2) at 550, which includes determining a new block is required at 552 (no); writing sector data to the first page of PBK#2 at 554; updating at the corresponding page usage flag (P0) in ACPUM at 556 and resetting sector update flags at 558;
(8) setting the ACPUMF (i.e., 1 for 'modified') at 536; and
(9) writing received data sector (S1) into the page buffer and marking corresponding sector ($2^{nd}$) update flag at 538 before going back to "IDLE".

Figure 6C:
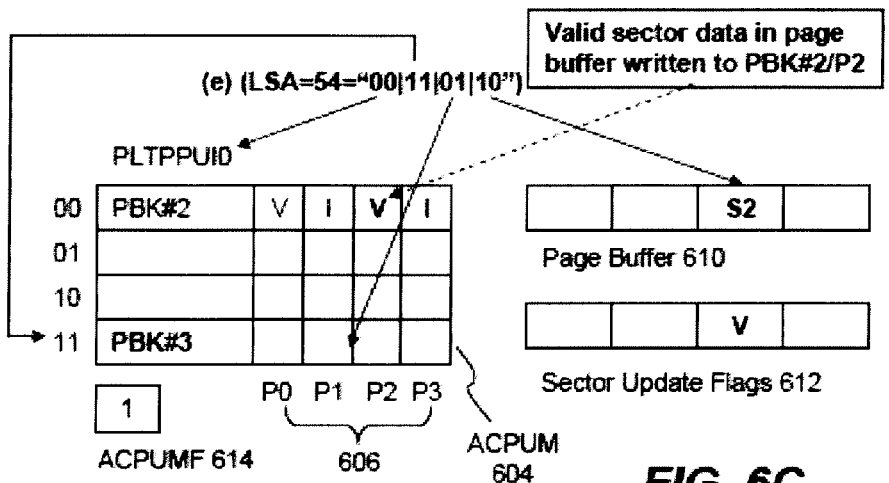

The next data write request (e) is to write to LSA=54 (FIG. 6C). The corresponding path is the process 500 is as follows:

(1) receiving an LSA=54 and extracting set, entry, page and set numbers at 502;
(2) determining whether ACPUM contains a current set of PLTPPUI at 504 (yes, PLTPPUI0);
(3) reading physical block number (PBK#3) at entry 3 (i.e., binary '11') at 516;
(4) determining data transfer request type at 518 (write);
(5) determining whether page buffer contents have been modified at 532 (yes);
(6) determining whether page and block number current at 534 (no, different block);
(7) writing the page buffer contents to the corresponding page (third page of PBK#2) at 550, which includes determining a new block is required at 552; writing sector data to the third page of PBK#2 at 554 (no); updating at the corresponding page usage flag (P2) in ACPUM at 556 and resetting sector update flags at 558;
(8) setting the ACPUMF (i.e., 1 for 'modified') at 536; and
(9) writing received data sector (S2) into the page buffer and marking corresponding sector ($3^{rd}$) update flag at 538 before going back to "IDLE".

Figure 6D:
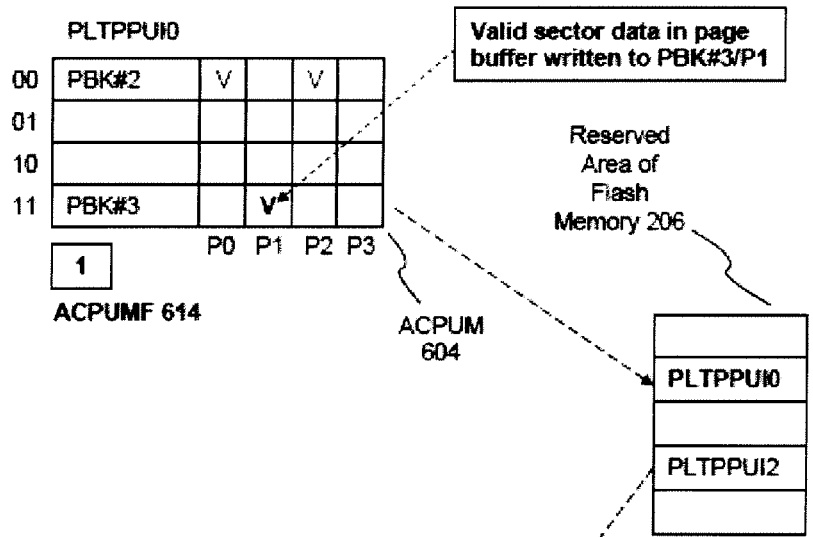
Figure 6D:
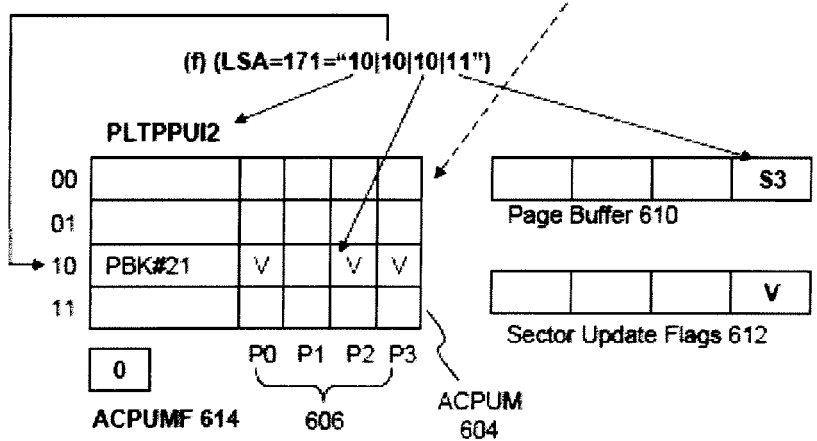

Finally, the next data write request (f) is to write to LSA=171 (FIG. 6D). The corresponding path is the process 500 is as follows:

(1) receiving an LSA=171 and extracting set, entry, page and set numbers at 502;
(2) determining whether ACPUM contains a current set of PLTPPUI at 504 (no, PLTPPUI0 does not match PLTPPUI2);
(3) determining whether the page buffer contents need to be stored at 506 (yes);
(4) writing the page buffer contents to the corresponding page (second page of PBK#3) at 550, which includes determining a new block is required at 552; writing sector data to the second page of PBK#3 at 554; updating at the corresponding page usage flag (P1) in ACPUM at 556 and resetting sector update flags at 558 and setting the ACPUMF (i.e., 1 for 'modified') at 508; (shown in upper half of FIG. 6D)

(5) determining whether ACPUM has bee modified at 510 (yes);

(6) writing the ACPUM contents to corresponding physical block corresponding to the first special logical address for particular one of the N sets of PLTPPUI (PLTPPUI0), which includes locating the physical block from the PLTPPUI tracking table at 582; determining if the physical block is full at 584 (no); writing the ACPUM contents to a next page in the physical block at 586; updating the PTLPPUI tracking table with the next page number as the highest page number at 588; and resetting the ACPUMF at 590 (i.e., 0 for 'un-modified');

(7) loading a corresponding set of PLTPPUI (PLTPPUI2) from MLC to ACPUM at 514;

(8) reading physical block number (PBK#21) at entry 2 (i.e., binary '10') at 516;

(9) determining data transfer request type at 518 (write);

(10) determining whether page buffer contents have been modified at 532 (no);

(11) writing received data sector into the page buffer ad marks the corresponding one of the sector update flags at 538 before going back to the 'IDLE' state;

(12) determining whether the 'IDLE' time has exceeded a predefined period at 540 (yes); and

Figure 6E:
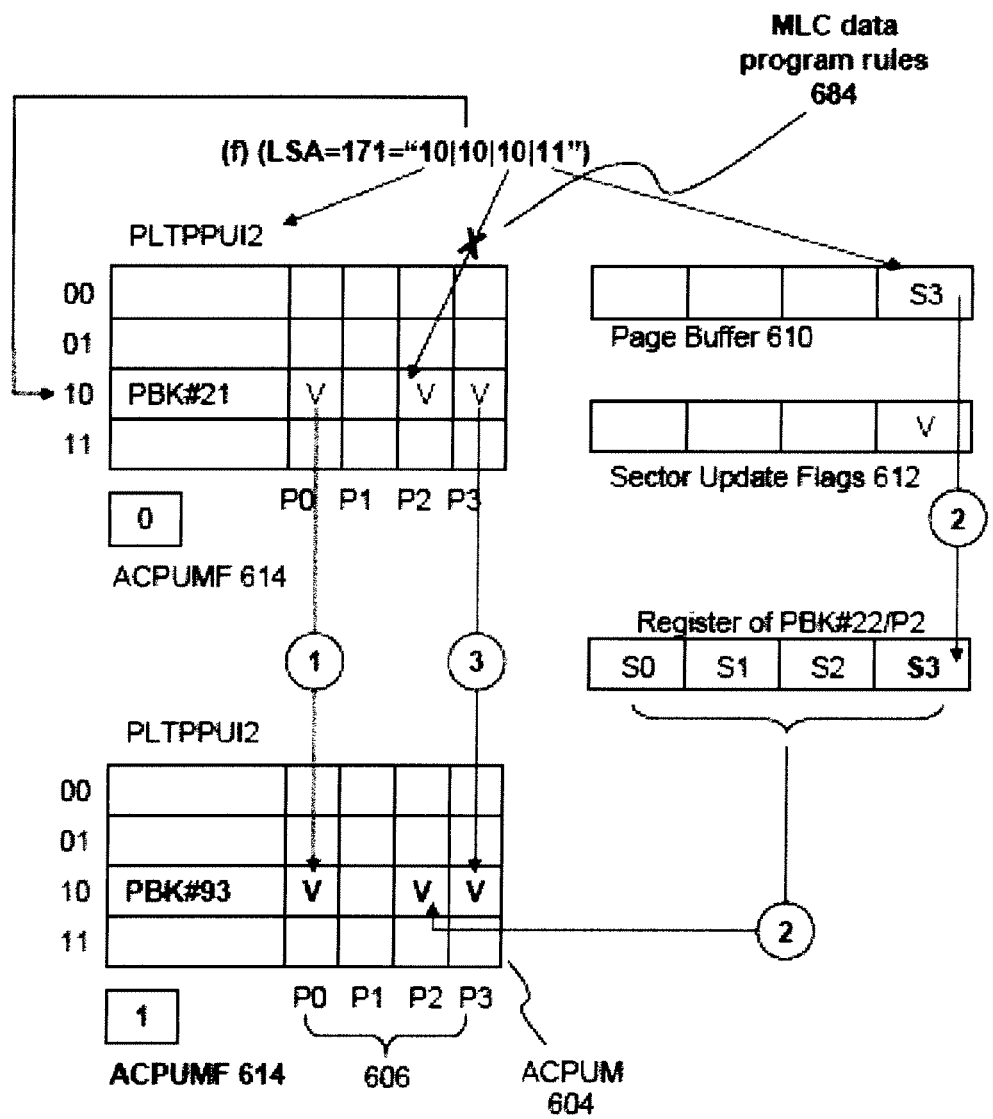

(13) performing background recycling of old blocks with stale data and writing the modified page buffer and ACPUM to MLC at 542 (more details in FIG. 6E).

FIG. 6E is a diagram showing a complicated data program or write involving a physical block containing data that prevents another data program operation directly in accordance with the MLC data programming rules. Using the sequence of data write requests shown in FIGS. 6A-6D, after the final data write request (f) has been completed. Both the page buffer 610 and ACPUM 604 have been modified, but yet to be stored in the flash memory. Due to data already existed in certain pages of the physical block (i.e. PBK#21), the MLC data program rules 684 prevent the modified page buffer 610 be written to PBK#21. A new blank block (i.e., PBK#93) is allocated and assigned to hold the data in the old block (PBK#21) including updates from the modified page buffer 610. The corresponding path in the step 550 of the process 500 is as follows:

(1) determining a new physical block is required according to the MLC rules at 552 (yes);

(2) allocating and assigning a new block based on the wear leveling rule at 554;

(3) updating the ACPUM 604 with the new block number (PBK#93) and same page usage flags at 564;

(4) if required, copying the valid pages with page number smaller than the current page number (i.e., P2 or $3^{rd}$ page derived from LSA) from the old block (PBK#21) to the new block PBK#93 at 566 (see STEP 1 in circle in FIG. 6E);

(5) writing sector data (S3) from the page buffer to the register of the corresponding page of PBK#93 and thus updating the page in PBK#93 at 568 (see STEP 2 in circle in FIG. 6E);

(6) if required, copying the valid pages with page number greater than the current page number (i.e., P2 or $3^{rd}$ page derived from LSA) from the old block (PBK#21) to the new block PBK#93 at 570 (see STEP 3 in circle in FIG. 6E); and (7) resetting the sector update flags at 558 before following the remaining data write steps of the process 500.

Referring now to FIGS. 7A-7E, which collectively are a flowchart illustrating an exemplary process 700 of initialization of a large capacity flash memory device in accordance with one embodiment of the present invention. The process 700 starts with a power up, for example, a flash memory device is plugged into a host 109. Next, the process 700 recreates the PLTPPUI tracking table 308 of FIG. 3 from stored N sets of PLTPPUI in the reserved area of the flash memory at 710. Then the process 700 validates the stored wear leveling and error correction code information with actual state of all of the physical blocks at steps 730 and 750, respectively. At 770, the process 700 verifies and validates the store PLTPPUI records against actual state of the physical blocks associated with a plurality of first special logical addresses. Finally, the process loads one of the N sets of PLTPPUI into ACPUM 306 at 790 before the initialization ends. The details of steps 710, 730, 750 and 770 are shown and described in respective FIGS. 7B, 7C, 7D and 7E.

Figure 7A:
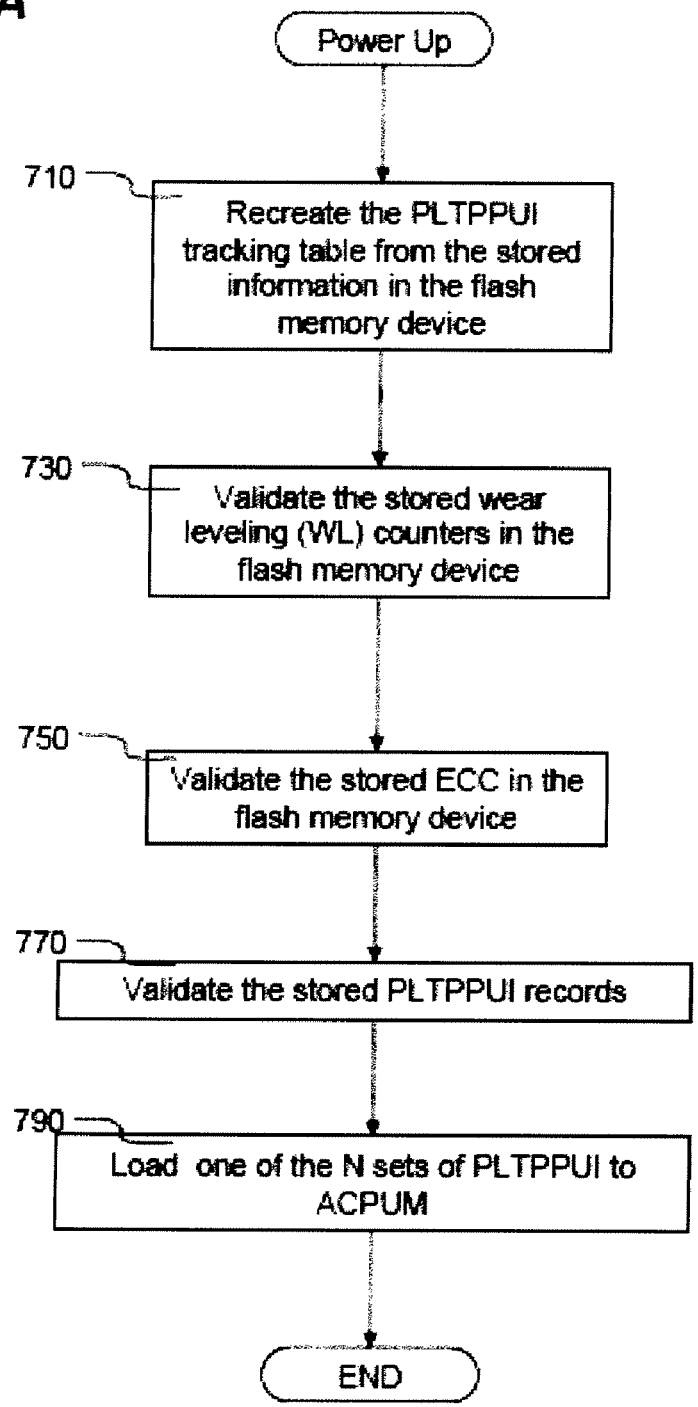
FIGS. 7A-7E collectively are a flowchart illustrating an exemplary process of initialization of a large capacity flash memory device in accordance with one embodiment of the present invention.
Figure 7B:
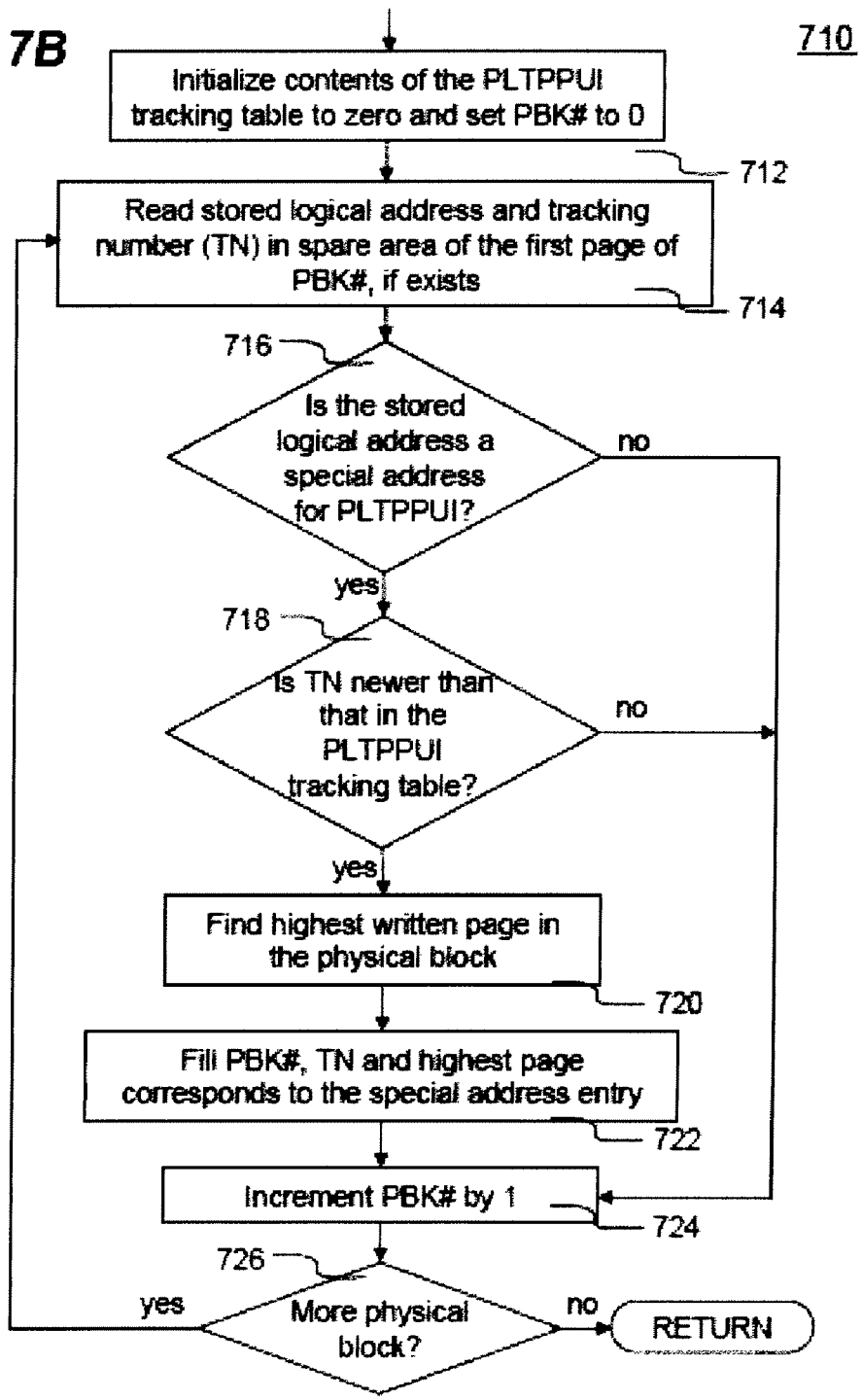

Shown in FIG. 7B, the process 700 initializes contents of the PLTPPUI tracking table 308 to zero and a physical block counter (PBK#) to 0 at 712. Next, the process 700 reads stored logical address and tracking number (TN) in the spare area of the first page of the physical block 'PBK#' at 714. Then the process 700 moves to decision 716, in which it is determined whether the stored logical address is one of the first special addresses for storing PLTPPUI issued by the FW and microcontroller. If 'no', the process 700 simply skips this physical block by incrementing the physical block counter 'PBK#' by one at 724. Next if additional physical block determined at decision 726, the process 700 moves back to step 714 for processing the next physical block, otherwise the step 710 is done.

If 'yes' at the decision 716, the process 700 follows the 'yes' branch to another decision 718. It is then determined whether the stored tracking number is newer than the one listed in the PLTPPUI tracking table 308. For example, the contents in the PLTPPUI tracking table is initialized to zero, any stored tracking number (TN) greater than zero indicates that the stored records are newer. If 'no' at decision 718, the process 700 skips this physical block similar to the 'no' branch of decision 716. However, if 'yes' at decision 718, the process 700 searches and locates a highest written page in this physical block 'PBK#' at 720. Next, at 722, the process 700 writes the 'PBK#', TN and highest page number in the PLTPPUI tracking table corresponding to the first special logical address. Finally, the process 700 increments the physical block count 'PBK#' by one at 724, then moves to decision 726 to determine either moving back to 714 for processing another physical block or ending the step 710.

Figure 7C:
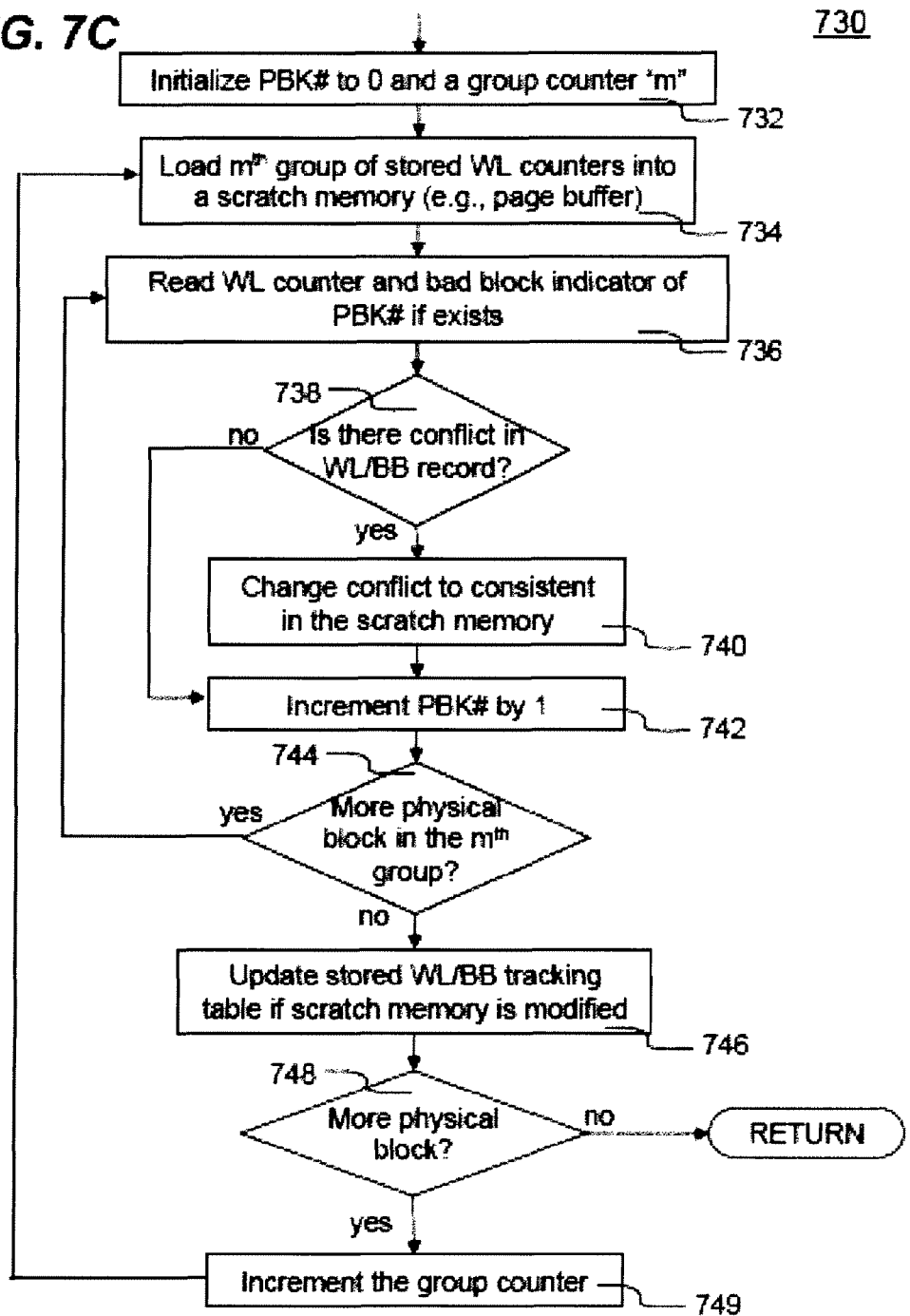

Details of step 730 are shown in FIG. 7C. At 732, the process 700 initializes a physical block counter 'PBK#' and a group counter 'm' to zero. Next, the process 700 loads a '$m^{th}$' group of stored WL/BB tracking table into a scratch memory space (e.g., the page buffer 314 of FIG. 3) at 734. Then the process 700 reads the wear leveling (WL) counter and bad block indicator for the physical block 'PBK#' at 736. The process 700 moves to decision 738, in which it is determined whether the stored information is in conflict with the physical state of 'PBK#'. If 'yes', the process 700 corrects the conflict information to be consistent with the physical state in the scratch memory at 740. If 'no' at decision 738, there is no need to correct the conflict.

Next, at 742, the physical block counter 'PBK#' is incremented by one. The process 700 moves to another decision 744, it is determined if there is additional block in the '$m^{th}$' group. If 'yes', the process 700 goes back to step 736 reading another WL counters of another physical block to repeat the above steps until the decision 744 becomes 'no'. The process 700 updates the stored WL/BB tracking table 310 at 746. At next decision 748, it is determined if there is any more physical block. If 'yes', the process 700 increments the group counter at 749 then goes back to 734 for repeating the above steps for another group. Otherwise, the step 730 returns when the decision 748 is 'no'.

Figure 7D:
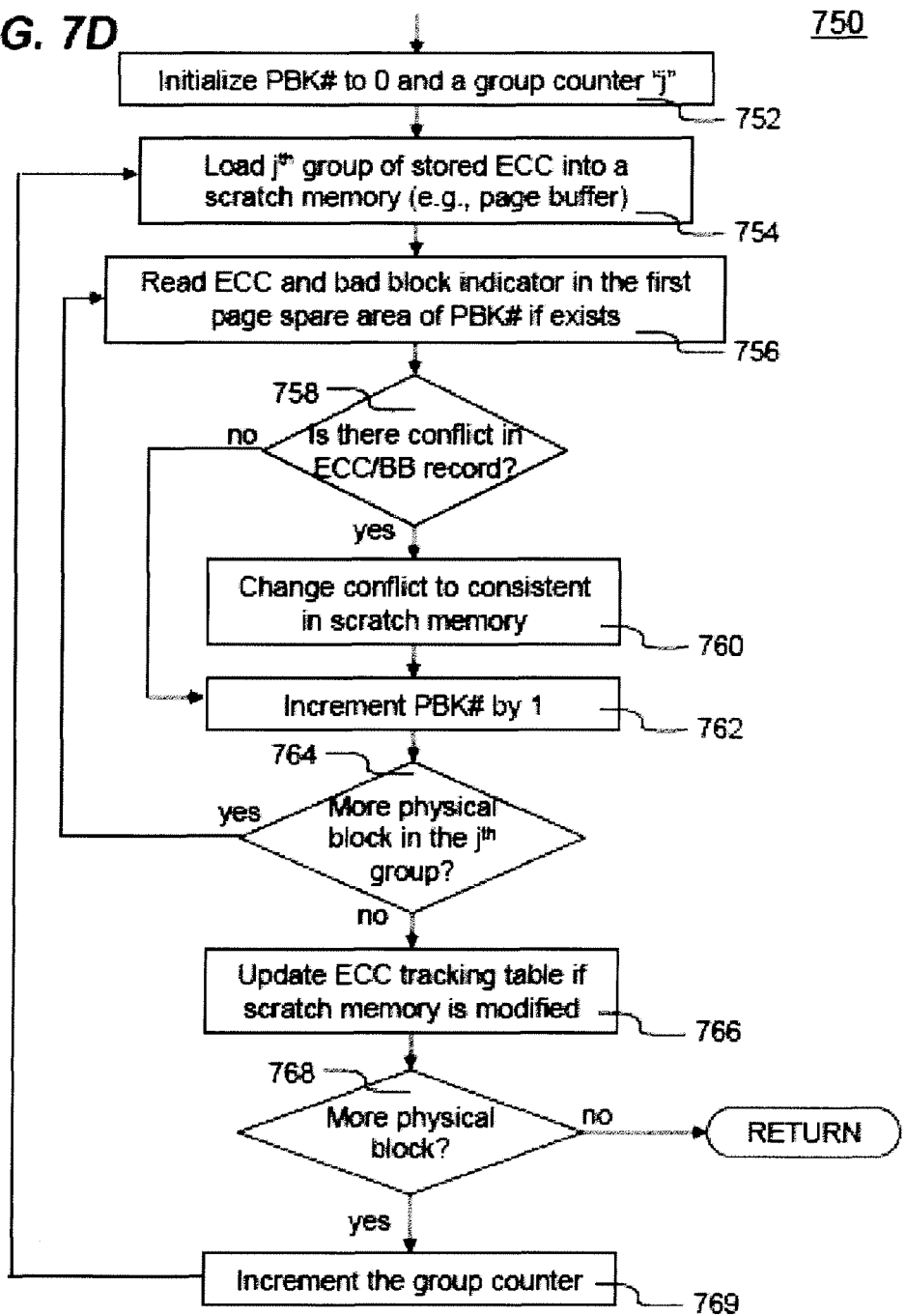

FIG. 7D shows details of step 750, which is substantially similar to the step 730. Instead of checking and correcting conflict WL/BB information, the step 750 validates and corrects the stored error correction code (ECC) for all physical blocks. The number of group is related to the size of the scratch memory. For example, a 2048-byte page buffer can provide space for holding a group of 1024 WL counters, if each of the WL counters is a 16-bit number. As to the 8-bit ECC, the same 2048-byte page buffer may hold a group of 2048 ECC codes.

Figure 7E:
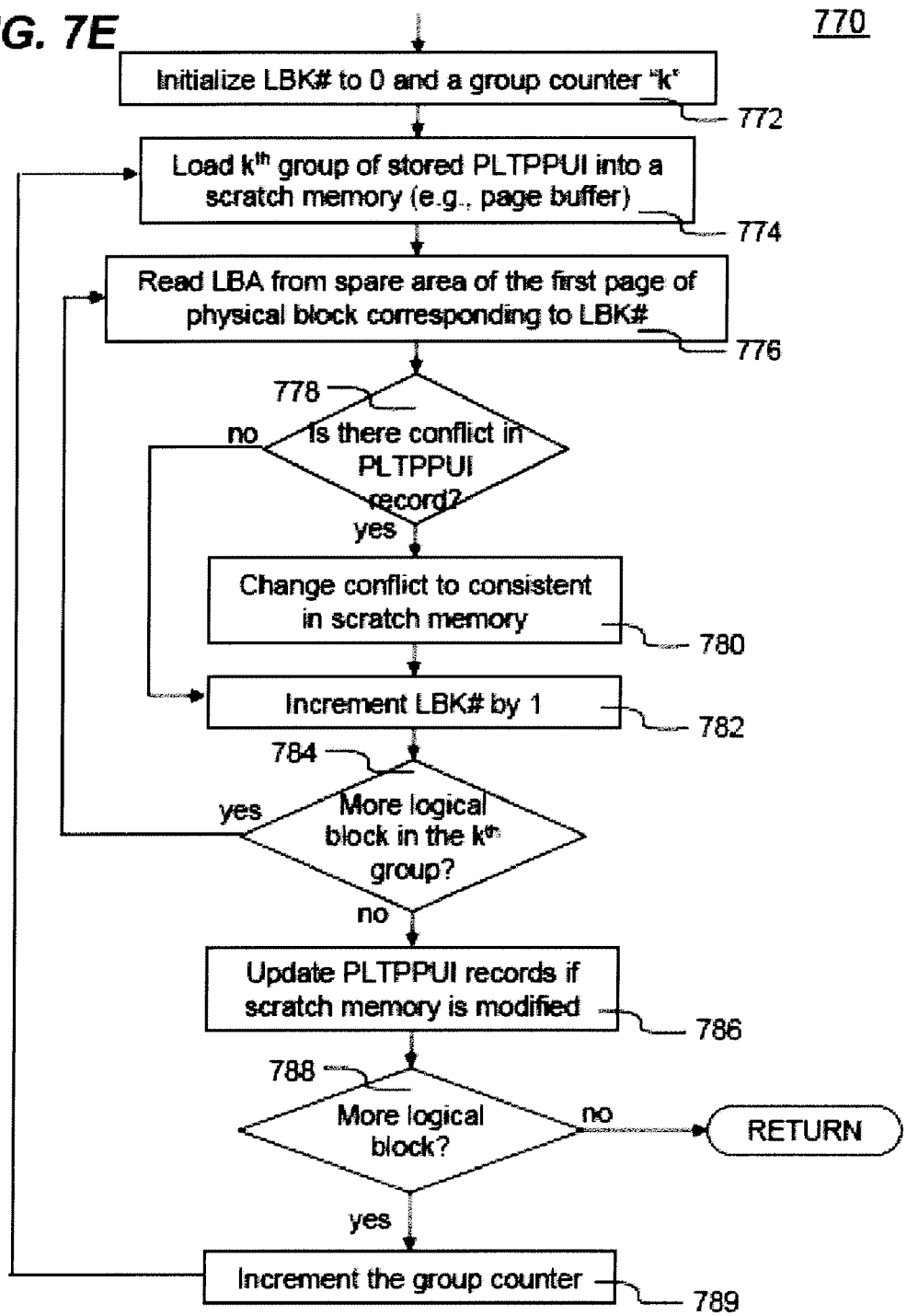

FIG. 7E shows details of step 770. At 772, the process 700 initializes a logical block counter 'LBK#' and a group counter 'k' to zero. The process 700 loads a '$k^{th}$' group of stored PLTPPUI into a scratch memory space (e.g., a page buffer or other available memory) at 774. The process 700 reads logical block address from the spare area of the first page of a physical block corresponding to the 'LBK#' at 776. Next, at decision 778, it is determined whether there is conflict between the stored PLTPPUI and the physical page usage of the physical block. If 'yes', the conflict is corrected with the physical state in the scratch memory at 780. Otherwise, the process 700 skips step 780. Next, at 782, the process 700 increments the logical block counter 'LBK#' by one. The process 700 then moves to another decision 784, in which it is determined if there is more block in the '$k^{th}$' group. If 'yes', the process 700 moves back the step 776 repeating the process until the decision 784 becomes 'no'. Then the process 700 updates the stored PLTPPUI records if the scratch memory has been altered at 786. Next, at decision 788, if there is more logical block, the process 700 follows the 'yes' branch to step 789 by incrementing the group counter and repeating the process from step 774 until the decision 788 becomes 'no', in which the step 770 ends.

Each entry record of PLTPPUI is 18-byte, which is a sum of 2-byte physical block number plus 128-bit (i.e., 16-byte) of page usage flags (i.e., 128 pages per block). Using 2048-byte page buffer as a scratch memory can only hold a group of 113 entry records. One may use a larger memory such as ACPUM 306 as the scratch memory, which may hold more entry records thereby reducing the initialization time.

Figure 1B:
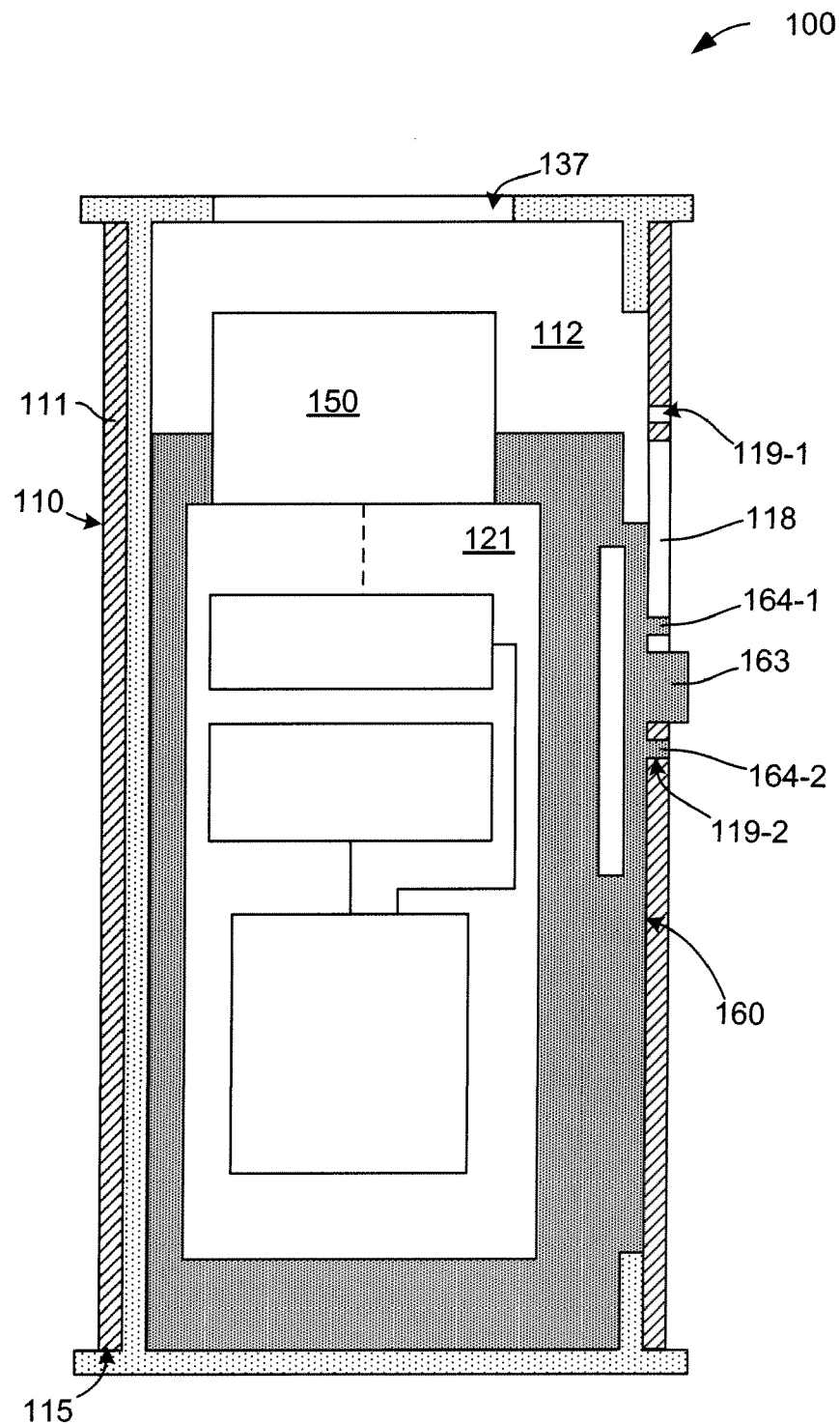

Referring again to FIG. 1(A) and to FIG. 1(B), the generalized embodiment of the present invention is directed to a pocket-sized, press-push (i.e., pen-type or retractable) portable computer peripheral (flash drive) device 100 that allows selective positioning of plug connector 150 into either a deployed position (indicated in FIG. 1(A)) or a retracted position (indicated in FIG. 1(B)). As indicated in FIG. 1(A), generalized peripheral device 100 includes an elongated tubular casing 110, a plastic housing assembly 130, and a carrier assembly 140 that includes PCBA 120 and plug connector 150.

Tubular casing 110 includes a tubular wall 111 that surrounds and defines an inner chamber 112, where tubular wall 111 has a front end portion 113 defining a front (first) opening 114, a rear end portion 115 defining a rear (second) opening 116, and an elongated actuating (third) opening 118 defined in tubular wall 111 between front and second end portions. As used herein, the term "tubular casing" is intended to denote a single-piece (e.g., integrally molded or machined) structure, such as those described with reference to the specific embodiments set forth below. Because tubular casing 110 includes an integral structure (e.g., single-piece molded or machined from a single block of metal or other hard material), the tubular casing provides durable and reliable protection for the electronic components disposed in the device.

Plastic housing assembly 130 includes a front (first) cap portion 132 that is fixedly connected over front end portion 113 of tubular casing 110, a rear (second) cap portion 134 that is fixedly connected over the rear end portion 115 of tubular casing 110, and a sleeve portion 136 that is disposed in inner chamber 112 of tubular casing 110 between front cap portion 132 and rear cap portion 134. Front cap portion 132 defines a front opening 137 that facilitates the deploying and retracting of plug connector 150 in the manner described below. Because plastic housing assembly 130 includes front cap portion 132 and rear cap portion 134 that are respectively disposed over opposing front and rear ends of tubular casing 110, and because assembly 130 includes sleeve portion 136 that extends entirely through tubular casing 110 between cap portions 132 and 134, the present invention addresses the manufacturing problems associated with the use of plastic and metal by providing for minor defects in the tubular casing size, and also prevents cuts or other injury that can occur if tubular casing 110 includes burrs or other defects along the front or rear edges that define front opening 114 or rear opening 116.

As indicated on the right side of FIG. 1(A), carrier assembly 140 includes PCBA 120 and plug connector 150. PCBA 120 includes several electronic devices (e.g., I/O interface circuit 125, processing unit 122 and MLC based flash memory chip 123, all described in detail above) that are mounted on a PCB 121, and plug connector 150 fixedly connected to PCB 121 and electronically connected to the electronic devices. Plug connector 150 disposed to protrude through front opening 137 when moved into the deployed position (e.g., such that plug connector 150 can be plugged into female socket 95 of host computing device 90, as shown in FIG. 1(A)).

In addition to PCBA 120 and plug connector 150, carrier assembly 140 also includes a plastic positioning member 160 that is selectively movably disposed in inner chamber 112 of tubular casing 110, and is fixedly connected to PCBA 120 and plug connector 150 such that selective movement of positioning member 160 relative to tubular casing 110 causes a corresponding movement of PCBA 120 and plug connector 150. Positioning member 160 is sized relative to tubular casing 110 such that relative movement between positioning member 160 and tubular casing 160 is restricted to a sliding motion along inner chamber 112 between front end portion 113 and rear end portion 114 (e.g., in a vertical direction in FIG. 1(A)). The selective movement of carrier assembly 140 is achieved through manual manipulation (e.g., sliding) of an actuating button 163 that extends from positioning member 160 and protrudes through actuating opening 118. For example, manually sliding actuating button 163 along actuating opening 118 toward front end portion 113 causes plug connector 150 to move into the deployed (first) position depicted in FIG. 1(A), where plug connector 150 extends through front end opening 137 such that plug connector 150 is exposed outside of tubular casing 110 for insertion into receptacle 95 of host computing device 90. Conversely, manually sliding actuating button 163 along actuating opening 118 toward rear end portion 115 causes plug connector 150 to retract through front opening 137 and move into the retracted (second) position shown in FIG. 1(B), where plug connector 150 is entirely disposed in inner chamber 112 of the tubular casing 110.

According to an aspect of the present invention, positioning member 160 is disposed relative to the sleeve portion 136 such that when actuating button 163 is manually slid along actuating opening 118 during movement of the plug connector 150 between the deployed and retracted positions, a portion of the positioning member 160 slides against the sleeve portion 136 instead of tubular casing 110. That is, when actuating button 163 is manually slid along actuating opening 118 a force component P associated with the sliding action pushes positioning member 160 into tubular casing 110 (e.g., to the left in FIG. 1(A)). Because sleeve portion 136 is disposed between the contact "sliding rail" portion 167 of positioning member 160 and tubular wall 111, force component P results in a plastic-on-plastic (i.e., contact "sliding rail" portion 167 against sleeve portion 136) contact instead of plastic-on-metal (i.e., contact "sliding rail" portion 167 against tubular wall 111), which would occur in the absence of sleeve portion 136, thereby avoiding the excessive wear and early failure that can occur when plastic slides directly on metal.

According to another aspect of the present invention, at least one of plastic housing assembly 130 and tubular casing 110 include a snap-coupling mechanism (e.g., snap-coupling mechanism 139, shown in FIG. 1(A)) that facilitates snap-coupled assembly of plastic housing assembly 130 onto tubular casing 110, thereby greatly simplifying the assembly process and providing for aesthetically pleasing final products, thus providing both low cost and high customer appeal. In general, snap-coupling mechanism 139 is formed such that, when plastic housing assembly 130 is mounted onto the tubular casing 110 and the snap-coupling mechanism 139 is operably engaged, tubular casing 110 is fixedly and rigidly held between front cap portion 132 and rear cap portion 134, with sleeve portion 136 fixedly maintained (i.e., stationary) inside inner chamber 112 of tubular casing 110.

According to yet another aspect of the invention, device 100 includes a locking mechanism for maintaining plug connector in each of the retracted and deployed position. For example, as indicated by the simplified embodiment of FIG. 1(A), a locking mechanism is formed by lock tabs (first locking structures) 164-1 and 164-2 that are integrally molded on positioning member 160 adjacent to actuating button 163. As indicated in FIG. 1(A), when actuating button 163 is slid to the foremost end of actuating opening 118, lock tab 164-1 is engaged with a front lock slot (second locking structure) 119-1, which is defined in tubular wall 111 adjacent to a front end of actuating opening 118, to securely maintain plug connector 150 in the deployed position. Conversely, as indicated in FIG. 1(B), when actuating button 163 is slid to the rearmost end of actuating opening 118, lock tab 164-2 is engaged with a rear lock slot (third locking structure) 119-2, which is defined in tubular wall 111 adjacent to a rear end of actuating opening 118, to securely maintain plug connector 150 in the retracted position.

Two exemplary MLC retractable flash memory devices incorporating the mechanism described with reference to FIGS. 1(A) and 1(B) will now be described. Each of these devices includes a housing structure formed by a metal tubular casing and a plastic housing assembly, and a carrier assembly which is enclosed inside the housing structure such that a USB plug connector can be manually deployed and retracted by sliding an actuating button either on the top or on the side of the housing structure in accordance with the specific embodiments set forth below.

Figure 8A:
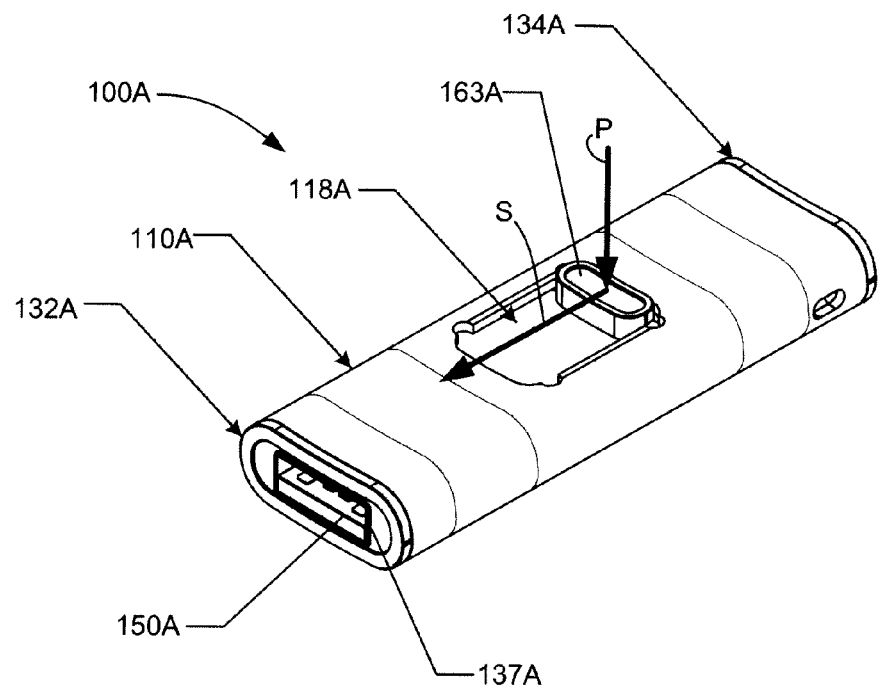
FIGS. 8(A) and 8(B) are perspective views showing a press-push flash drive device in alternative closed and open positions, respectively, according to a specific embodiment of the present invention.
Figure 8B:
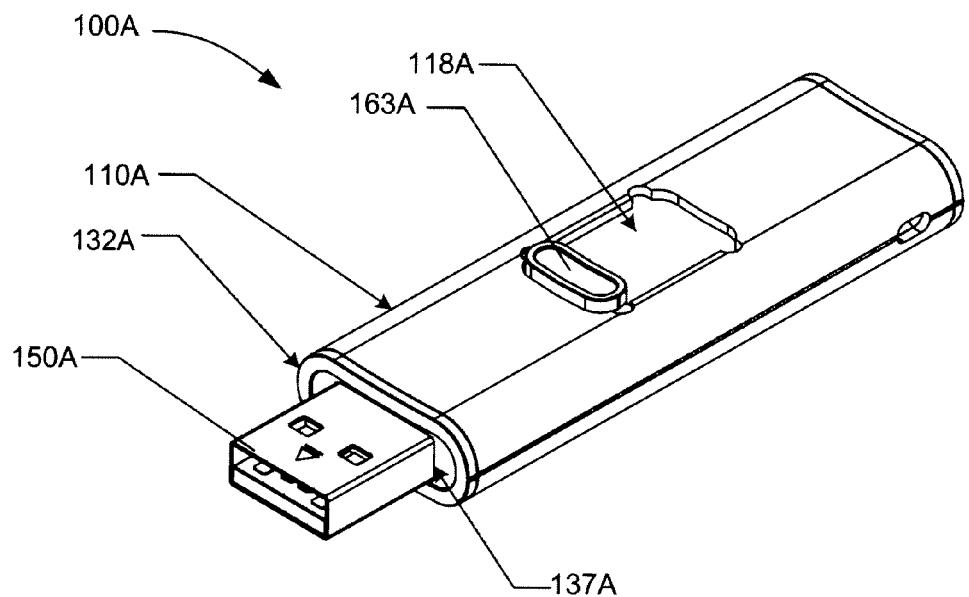

FIGS. 8(A) and 8(B) are perspective top views showing a pocket-sized, press-push (i.e., pen-type or retractable) portable computer peripheral flash drive apparatus (device) 100A having a retractable Universal Serial Bus (USB) plug connector 150A according to a first specific embodiment of the present invention. In this embodiment the flash memory device is a slide MLC USB flash drive including the MLC based flash memory chip described in detail above. As shown in FIG. 8(A), in a fully retracted position, USB plug connector 150A is retracted through a front opening 137A defined by a front cap 132A into a metal tubular casing 110A such that connector 150A is safely disposed inside metal tubular casing 110A. A press-push button 163A is integrally connected to a positioning member (not shown, described below) and is partially exposed through a slot 118A to facilitate manual movement from the fully retracted (first) position shown in FIG. 8(A), to the fully deployed (second) position shown in FIG. 8(B). In particular, plug connector 150A is deployed from metal tubular casing 110A by manually pressing press-push button 163A in the direction of arrow P into metal tubular casing 110A, and then manually sliding button 163A forward along slot 118A (i.e., in the direction of arrow S in FIG. 8(A)). When plug connector 150A is deployed/exposed outside metal tubular casing 110A, device 100A can be plugged into a host computer and function in the programming, data retrieving, and data resetting modes described above. Once the desired operations are completed, plug connector 150A is retracted into metal tubular casing 110A by pressing press-push button 163A and manually pulling backward, which causes button 163A to retract backward along slot 115A (i.e., in the direction opposite to arrow S in FIG. 8(A)).

Figure 9:
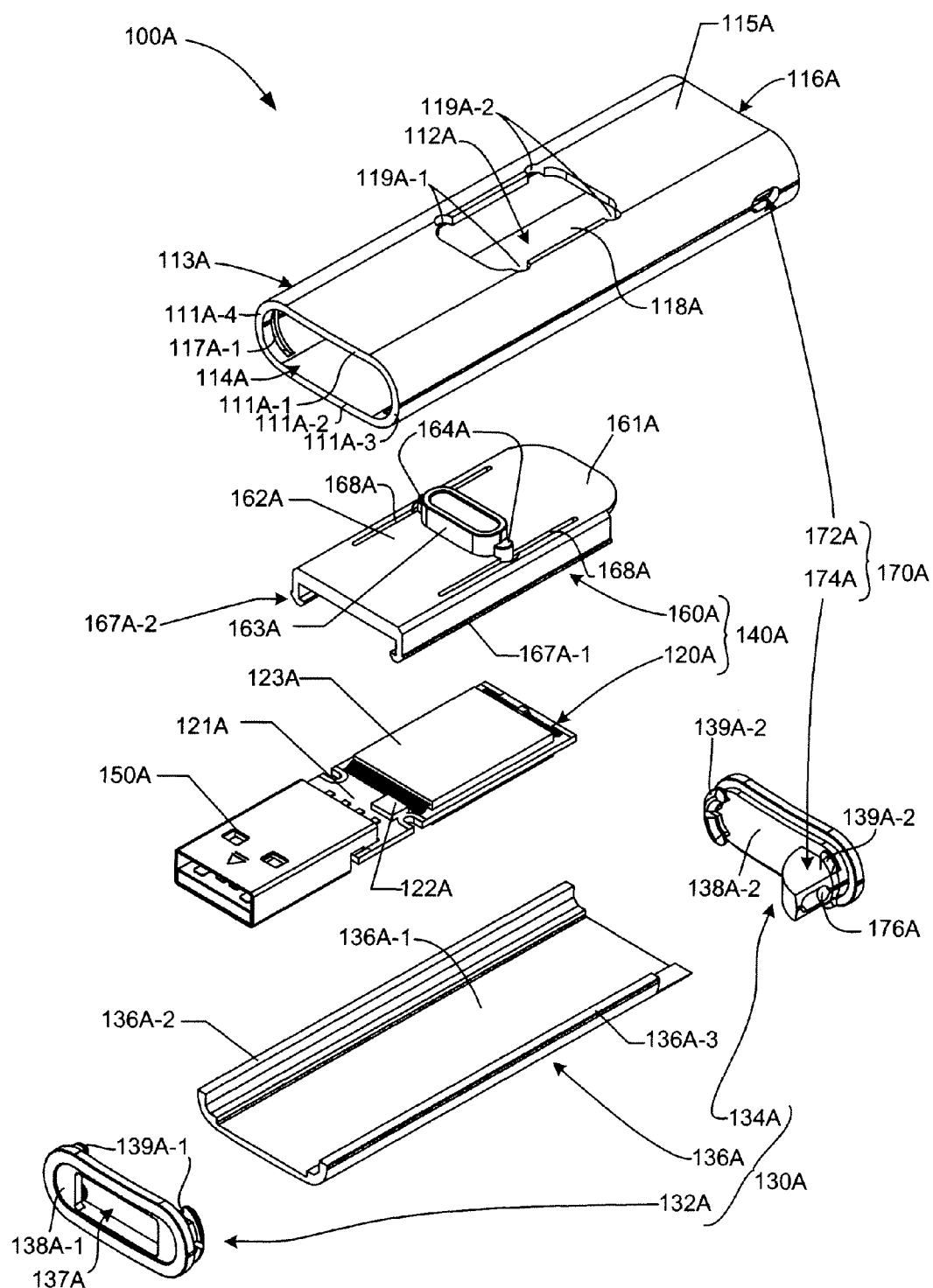
FIG. 9 is an exploded perspective view showing the device of FIG. 8(A) in additional detail.

FIG. 9 is an exploded perspective view showing device 100A in additional detail. Device 100A generally includes a metal tubular casing 110A, a plastic housing assembly 130A operably fixedly connected to metal tubular casing 110A in the manner described below, and a carrier assembly 140 including a printed circuit board assembly (PCBA) 120A, USB plug connector 150A mounted on PCBA 120A, and a plastic manual (slide) positioning member 160A that are mounted inside of housing 110A in the manner described below.

As indicated in FIG. 9, metal tubular casing 110A includes an integrally molded, machined or otherwise formed metal (e.g., aluminum) tubular wall 111A including an upper wall portion 111A-1, a lower wall portion 111A-2 that is parallel to upper wall portion 111A-1, and integrally connected opposing semi-cylindrical side wall portions 111A-3 and 111A-4 that collectively surround an inner chamber 112A. Tubular wall 111A has a front end portion 113A defining a front opening 114A, a rear end portion 115A defining a rear opening 116A, and an actuating (third) opening 118A defined in upper wall portion 111A-1. Semi-circular grooves (e.g., lock grooves 117A-1) are defined on the inside surfaces of semi-cylindrical side wall portions 111A-3 and 111A-4 adjacent to both front opening 114A and rear opening 116A, and function as described below. Lock slots (second locking structures) 119A-1 and 119A-2 are defined at the front and rear ends, respectively, of actuating opening 118A, and function as described below.

As shown at the bottom of FIG. 9, plastic housing assembly 130A includes a front cap portion 132A , a rear cap portion 134A, and a sleeve portion 136A, all of which are formed from a suitable plastic using known techniques. Front cap portion 132A includes a front wall 138A-1 that defines a front opening 137A, and also includes front lock pawls 139A-1 that are arranged in a semi-circular shape and disposed behind front wall 138A-1. Rear cap portion 134A includes a rear wall 138A-2 and rear lock pawls 139A-2 that are arranged in a semi-circular shape and disposed in front of rear wall 138A-2. Sleeve portion 136A includes an elongated, substantially flat bottom wall 136A-1 and two curved elongated side walls 136A-2 and 136A-3 that extend upward from the side edges of bottom wall 136A-1, where bottom wall 136A-1 and side walls 136A-2 and 136A-3 are shaped to fit snuggly against the inside surface of lower wall 111A-2 and the lower portion of side walls 111A-3 and 111A-4 of tubular casing 110A.

Referring to the center of FIG. 9, sliding rack assembly 140A includes a PCBA 120A having USB plug connector 150A attached thereon, and a plastic positioning member (slide rack) 160A.

Referring to lower center of FIG. 9, PCBA 120A includes a printed circuit board (PCB or card) 121A and USB plug (metal) connector 150A that is attached to a front end of PCB 121A using known techniques such that PCB 121A is approximately aligned (centered) with USB metal connector 150A. As discussed above, PCB 121A includes several ICs (e.g., a controller or processing unit 122A and flash memory 123A) disposed thereon. The ICs are electronically connected together and to connector 150A using known techniques.

Referring to upper center of FIG. 9, positioning member 160A includes a base portion 161A and a flexible wall 162A that is connected to base portion 161A by way of elongated slots (openings) 168A such that flexible wall 162A is resiliently bendable relative to base portion 161A in the manner described below. Press-push button 163A extends upward from flat flexible wall 162A. Lock tabs (first locking structures) 164A also extend upward from flat flexible surface 162A next to button 163A. First and second slide rails 167A-1 and 167A-2 are fixedly connected to and extend substantially perpendicular to base portion 161A.

According to an aspect of the present embodiment, a key chain feature 170A of device 100A is formed by an opening 172A defined in side wall 111A-3 of tubular casing 110A, and by a protrusion 174A defining a corresponding opening 176A that extends through protrusion 174A to rear wall 138A-2. As described below, when rear cap portion 134A is mounted onto tubular casing 110A, protrusion 174A enters inner chamber 112A such that opening 176A aligns with opening 172A, thereby allowing a key chain or other elongated structure to be fed through opening 176A to secure device 100A.

The assembly of press-push flash drive device 100A will now be described with reference to FIGS. 10-13.

Figure 10A:
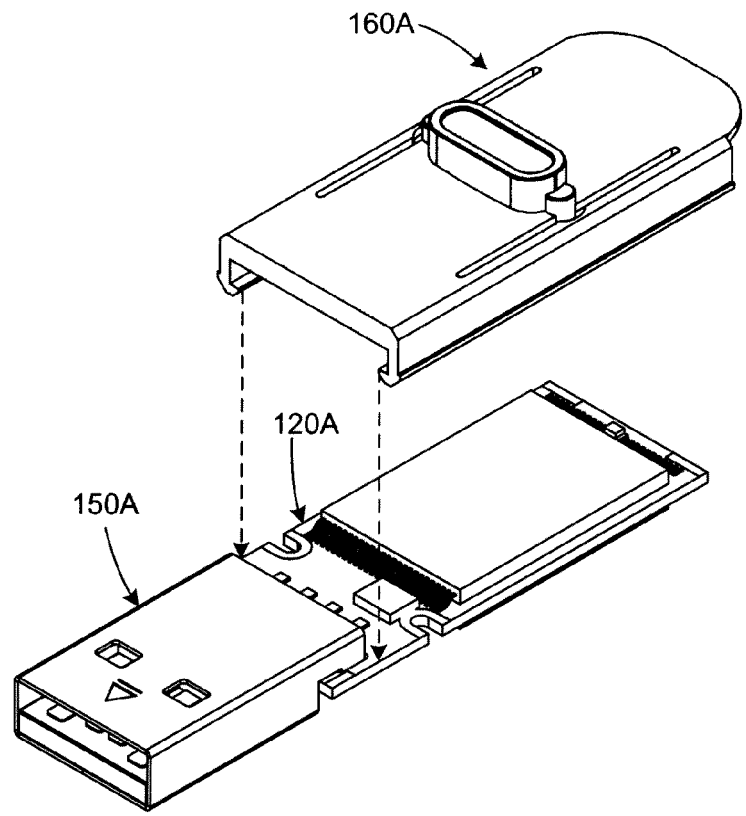
FIGS. 10(A) and 10(B) are exploded perspective and perspective views, respectively, showing a sliding rack assembly of the device of FIG. 8(A) during a first assembly stage according to an aspect of the present embodiment.
Figure 10B:
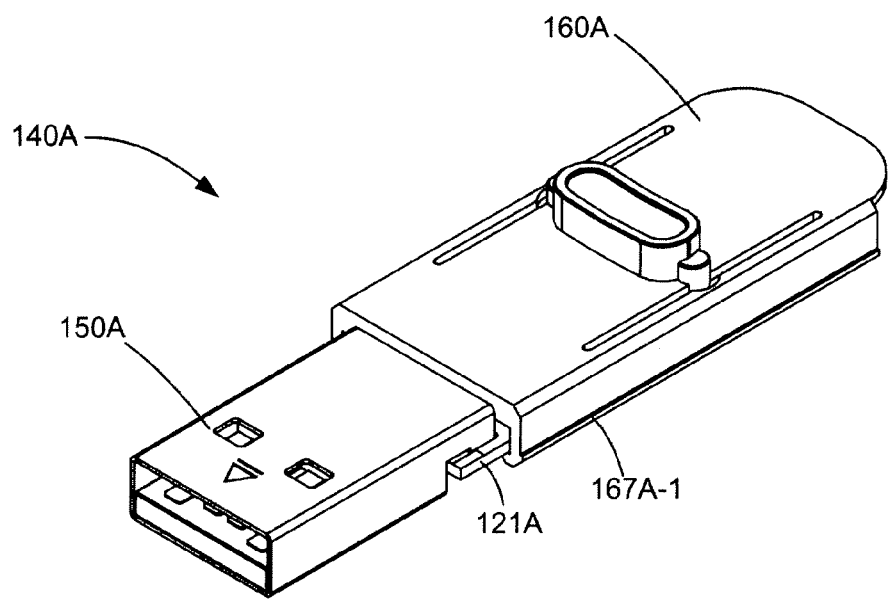

As indicated in FIGS. 10(A) and 10(B), during a first assembly stage, PCBA 120A (with connector 150A already attached) is mounted onto positioning member 160A with plug connector 150A extending from the front thereof, and then PCBA 120A is pressed against positioning member 160A until elongated locking tabs disposed on the bottom inside surface of the slide rails (e.g., slide rail 167A-1, as shown) snap over the side edges of PCB 121A, thereby forming carrier assembly 140A.

Figure 11A:
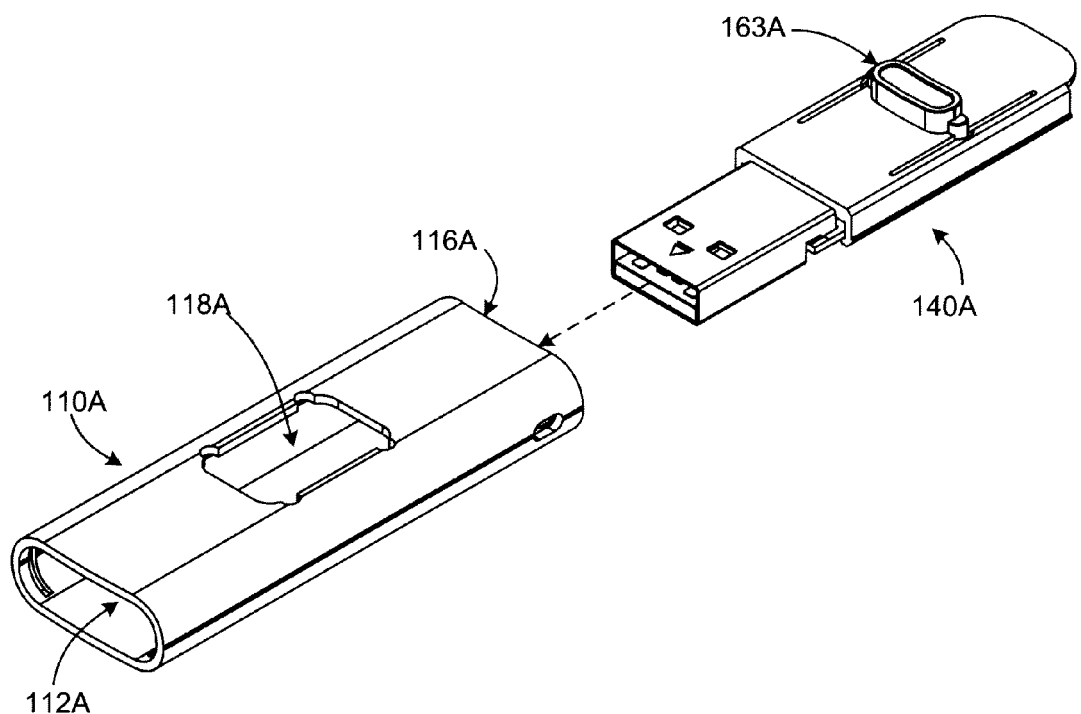
FIGS. 11(A) and 11(B) are exploded perspective and perspective views, respectively, showing the sliding rack assembly of FIG. 10(B) during insertion into a tubular casing during a second assembly stage according to another aspect of the present embodiment.
Figure 11B:
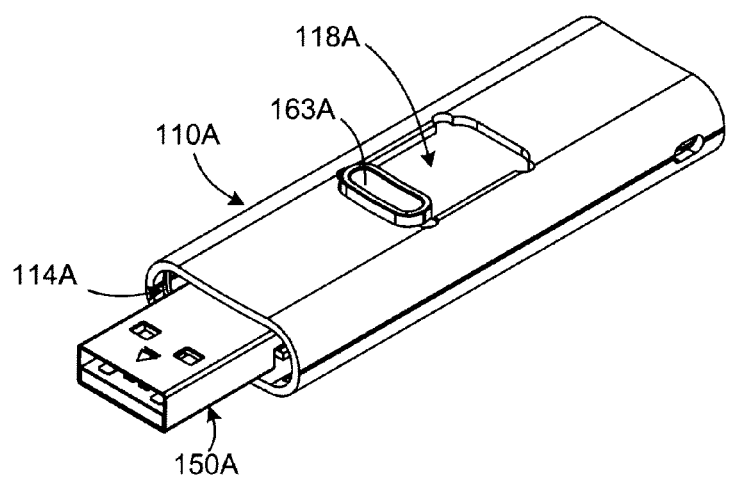
Figure 12A:
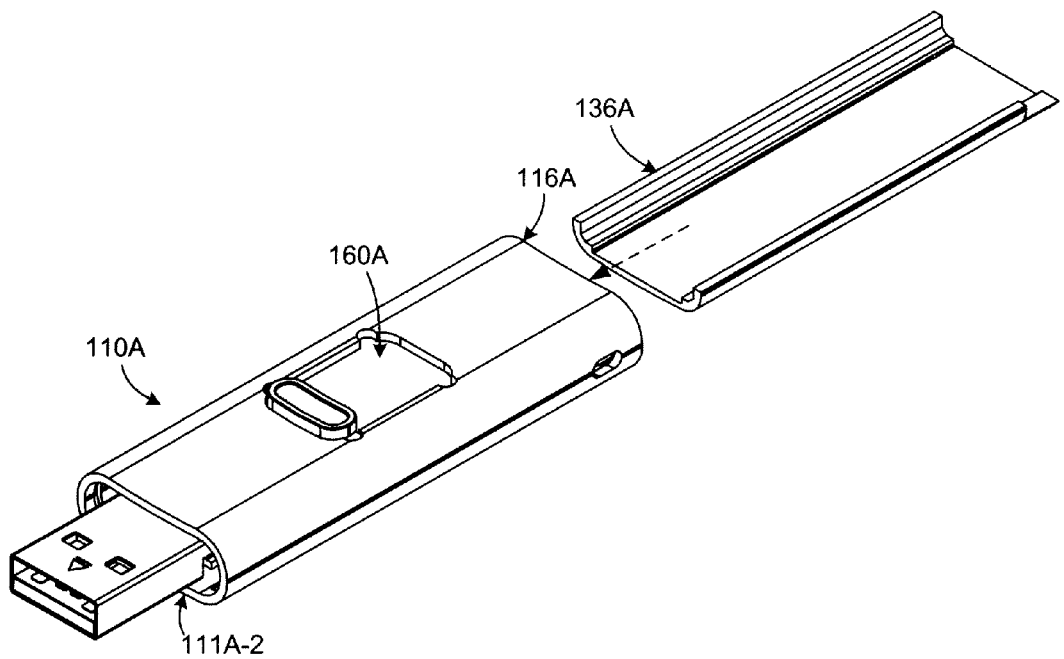
FIGS. 12(A) and 12(B) are exploded perspective and perspective views, respectively, showing the partial assembly of FIG. 11(B) during insertion of a sleeve portion during a third assembly stage according to another aspect of the present embodiment.
Figure 12B:
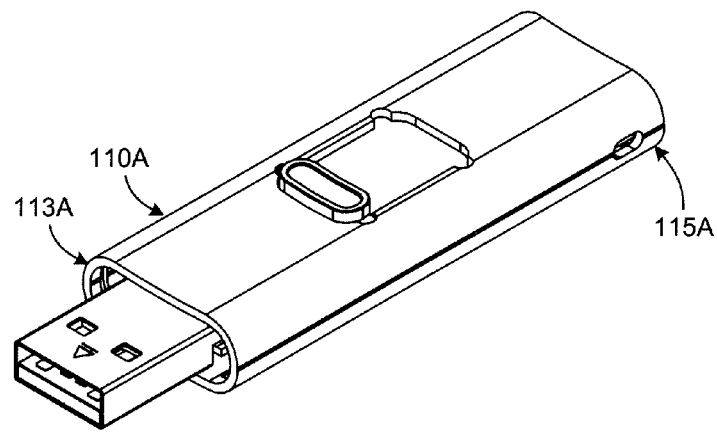

Referring to FIGS. 11(A) and 11(B), during a second assembly stage, carrier assembly 140A is then inserted into inner chamber 112A of metal tubular casing 110A (e.g., through rear opening 116A) such that a portion of actuating button 163A (which extends from flat flexible wall 162A) protrudes through actuation slot 118A with lock tabs. As indicated in FIG. 11(B), when assembled such that actuating button 163A is disposed at the front end of actuation slot 118A, plug connector 150A extends through front opening 114A of tubular casing 110A Referring to FIGS. 12(A) and 12(B), during a third assembly stage, sleeve portion 136A of plastic housing assembly 130A is inserted between positioning member 160A and lower wall portion 111A-2 of tubular casing 110A (i.e., such that sleeve portion 136A is disposed between the slide rails of positioning member 160 and lower wall portion 111A-2). As indicated in FIG. 12(B), when properly installed, the sleeve portion (not shown) is disposed inward from front end portion 113 and rear end portion 115 to facilitate the cap mounting stage, described below.

Figure 13A:
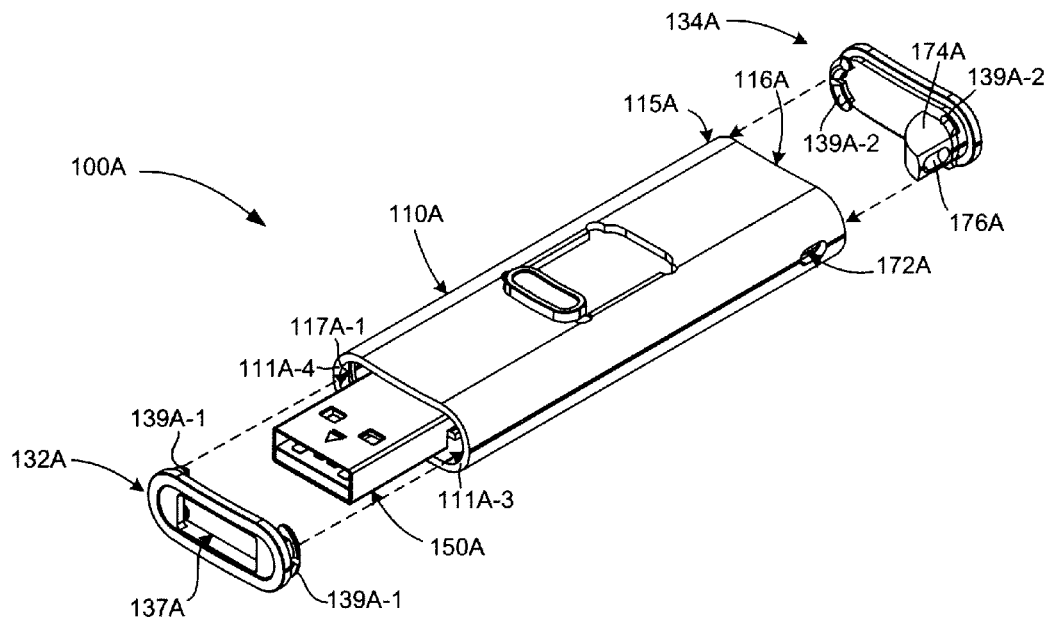
FIGS. 13(A) and 13(B) are exploded perspective and perspective views, respectively, showing the partial assembly of FIG. 12(B) during snap-coupling of front and rear cap portions during a fourth assembly stage according to another aspect of the present embodiment.
Figure 13B:
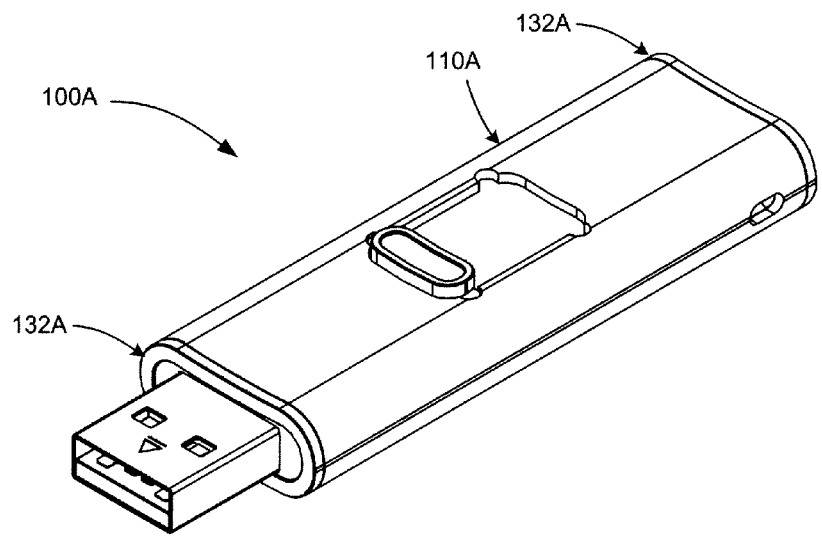

Referring to FIGS. 13(A) and 13(B), during a final assembly stage, front and rear cap portions 132A and 134A of plastic housing assembly 130A are mounted onto front and rear end portions 113A and 115A, respectively, of tubular casing 110A. In particular, front cap portion 132A is mounted onto front end portion 113A such that plug connector 150A is received inside front opening 137A, and elongated lock pawls 139A-1 engage (snap-couple into) corresponding locking grooves 117A-1 formed on the inside surface of tubular casing 110A. Rear cap portion 134A is similarly mounted onto rear end portion 115A such that lock pawls 139A-2 engage corresponding locking grooves (not shown) that are formed on the inside surface of tubular casing 110A, and such that protrusion 174A is disposed inside tubular casing 110A with opening 176A aligns with opening 172A. FIG. 13(B) shows device 100A after assembly of front cap portion 132A and rear cap portion 134A onto tubular casing 110A is completed.

Figure 14A:
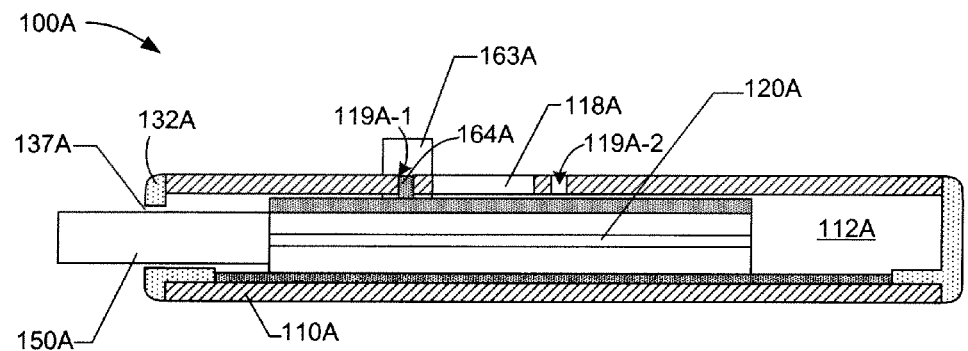
FIGS. 14(A), 14(B) and 14(C) are simplified cross-sectional side views depicting the peripheral device of FIG. 8(A) during operation.
Figure 14B:
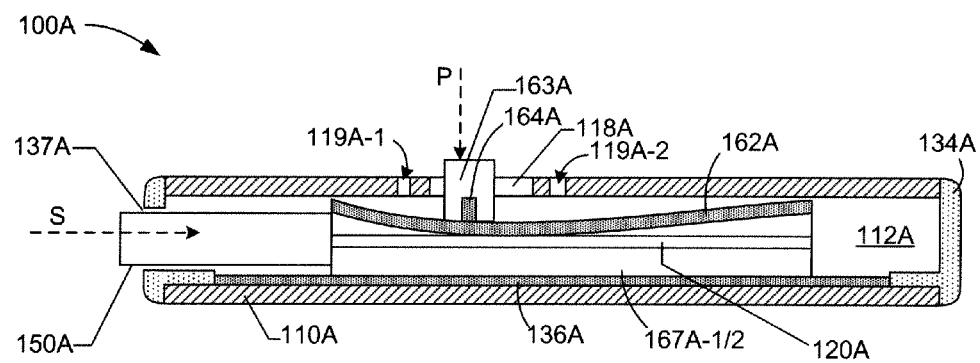
Figure 14C:
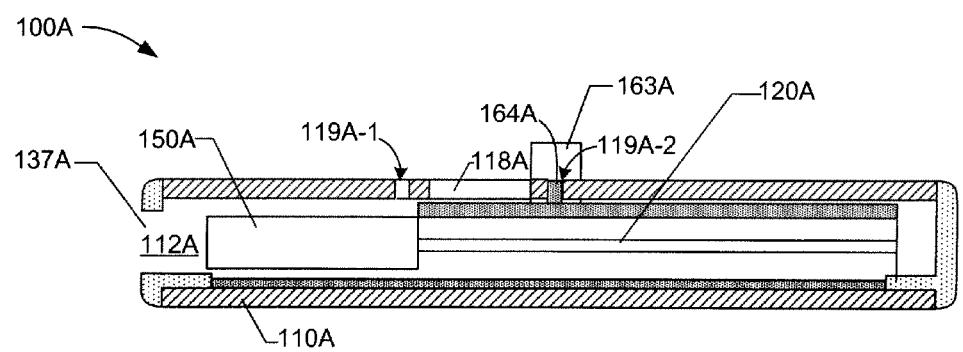

FIGS. 14(A) to 14(C) are simplified cross-sectional side views showing peripheral device 100A during a deployment operation. In the retracted state shown in FIG. 14(A), plug connector 150A is disposed in inner chamber 112A of tubular casing 110A, and protrusions (lock tabs) 164A are engaged in rear lock slots 119A-2. As indicated in FIG. 14(B), pressing down button 163A (i.e., in the direction of arrow P) releases protrusions 164A from rear lock slots 119A-2, and pushing button 163A forward (i.e., in the direction of arrow S) along actuation slot 118A causes the sliding rack assembly (e.g., PCBA 120A) to be propelled forward inside tubular casing 110A such that plug connector 150A begins to deploy through front opening 137A of cap 132A. Note that the downward pressing force bends flexible wall 162A downward in order to facilitate releasing protrusions 164A from rear lock slots 119A-2. Note also that the downward force P causes the lower end of slide rails 167A-1 to slide against sleeve portion 136A during the deploying operation, which prevents plastic-on-metal wear that would be produced in the absence of sleeve portion 136A. As indicated in FIG. 14(C), when plug connector 150A is pushed fully into its deployed position such that it extends through front end opening 137A and button 163A is released, flexible wall 162A resiliently returns press-push button 163A to its original (raised) position, whereby protrusions 164A engage in front lock slots 119A-1 to secure device 100A in the deployed position. Subsequent return to the retracted position requires pressing button 163A downward and manually sliding the assembly back into the retracted position.

Figure 15A:
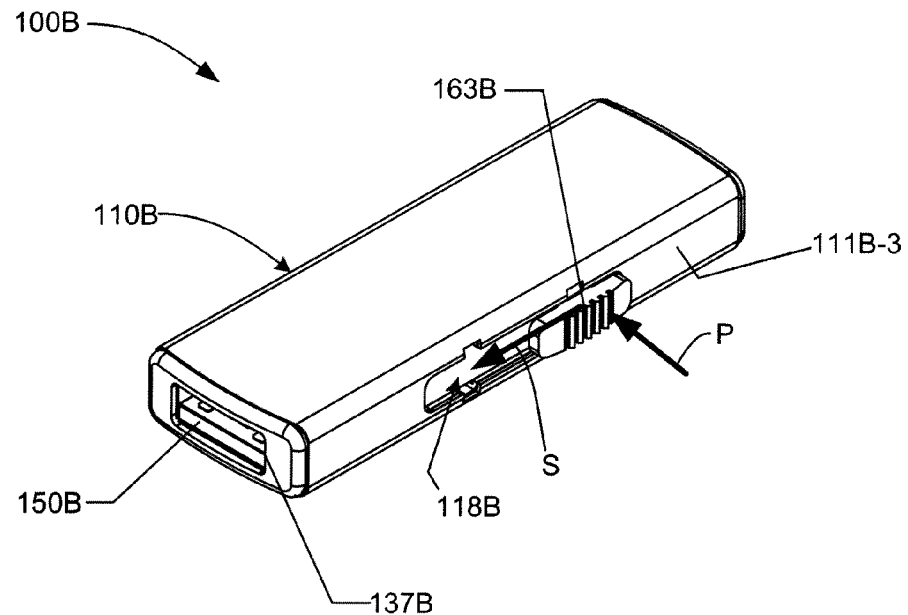
FIGS. 15(A) and 15(B) are perspective views showing a press-push flash drive device in alternative closed and open positions, respectively, according to another specific embodiment of the present invention.
Figure 15B:
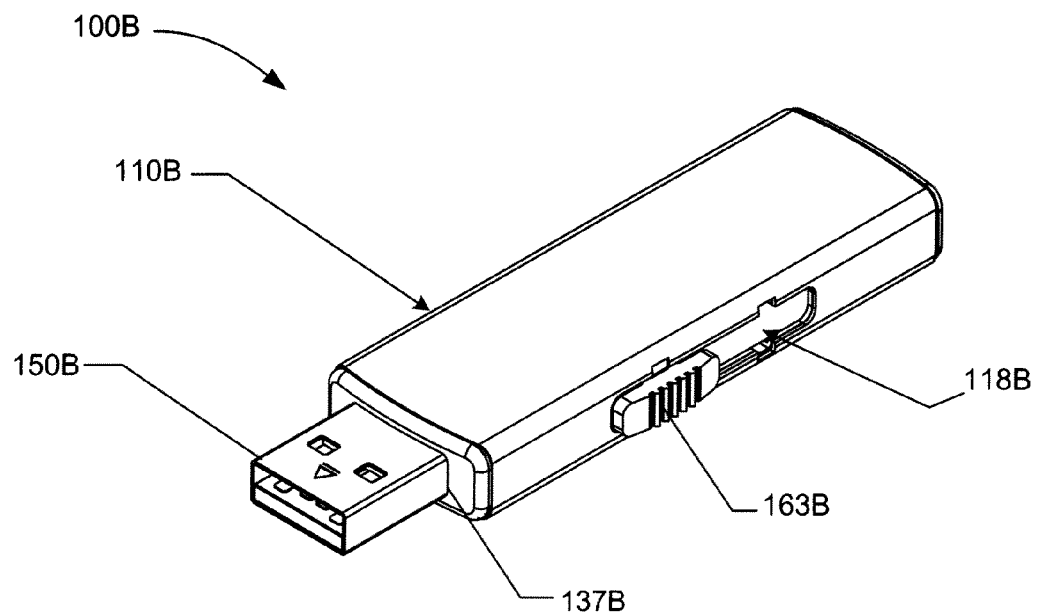

FIGS. 15(A) and 15(B) are perspective top views showing a pocket-sized, press-push (i.e., pen-type or retractable) portable computer peripheral flash drive apparatus (device) 100B having a retractable USB plug connector 150B and a side-mounted actuating button 163B according to another specific embodiment of the present invention. Similar to the first embodiment (described above), in a fully retracted position (shown in FIG. 15(A)), USB plug connector 150B is retracted through a front opening 137B defined by elongated tubular casing 110B, and a press-push actuating button 163B that is integrally connected to a positioning member (not shown, described below), is disposed at a rear end of an actuating slot 118B defined in a side wall 111B-3 of a tubular casing 110B. Also similar to the first embodiment (described above), USB plug connector 150B is deployed by applying an inward pressing force P and a forward sliding force S to actuating button 163B, as shown in FIG. 15(A), which causes actuating button 163B to move forward along actuating slot 118B from the fully retracted (first) position shown in FIG. 15(A) to the fully deployed (second) position shown in FIG. 15(B) in which USB plug connector 150B protrudes out of tubular casing 110B through front opening 137B.

Figure 16:
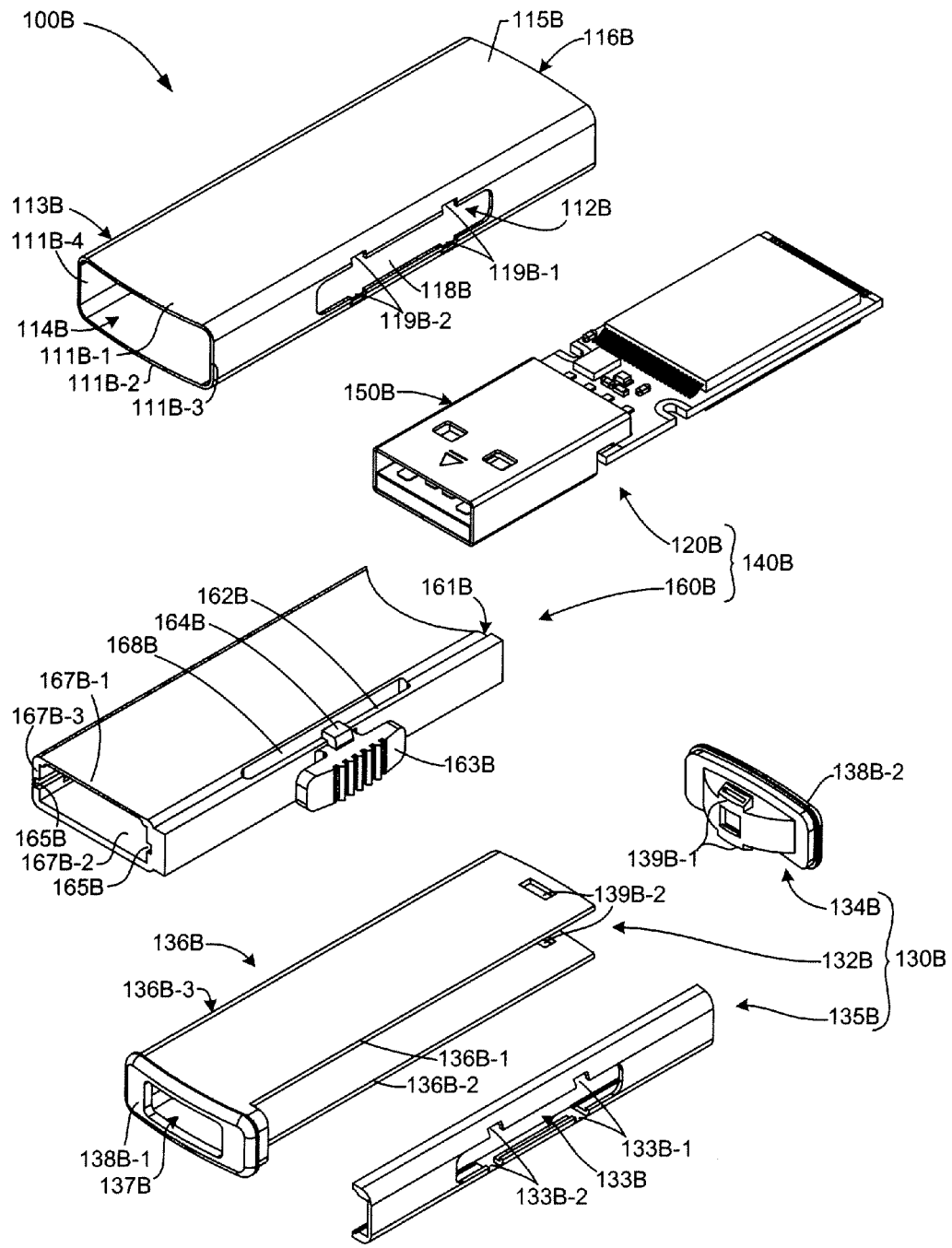
FIG. 16 is an exploded perspective view showing the device of FIG. 15(A) in additional detail.

FIG. 16 is an exploded perspective view showing device 100B in additional detail. Device 100B generally includes a metal tubular casing 110B, a plastic housing assembly 130B, and a carrier assembly 140 including a printed circuit board assembly (PCBA) 120B, USB plug connector 150B mounted on PCBA 120B, and a plastic manual (slide) positioning member 160B that are mounted inside of housing 110B in the manner described below.

As indicated at the upper portion of FIG. 16, metal tubular casing 110B includes box-shaped tubular wall 111B including an upper wall portion 111B-1, a lower wall portion 111B-2 that is parallel to upper wall portion 111B-1, and integrally connected opposing parallel side wall portions 111B-3 and 111B-4 that collectively surround an inner chamber 112B. Tubular wall 111B has a front end portion 113B defining a front opening 114B, a rear end portion 115B defining a rear opening 116B, and an actuating (third) opening 118B defined in upper wall portion 111B-1. Lock slots (second locking structures) 119B-1 and 119B-2 are defined at the front and rear ends, respectively, of actuating opening 118B, and function as described below.

As shown at the bottom of FIG. 16, plastic housing assembly 130B is made up of plastic molded parts including a front cap portion 132B, a rear cap portion 134B, and a side sleeve portion 135B. Similar to the previously described embodiment, front cap portion 132B includes a front wall 138B-1 that defines a front opening 137B, and rear cap portion 134B includes a rear wall 138B-2 and rear lock pawls 139B-2 that are arranged in on a semi-circular flange and disposed in front of rear wall 138B-2.

According to an aspect of the present embodiment, side sleeve portion 135B is shaped to fit against side wall portion 111B-3 of tubular casing 110B, and defines an actuating slot 133B that is sized to generally align with actuating opening 118B of tubular casing 110B. In addition, side sleeve portion 135B also defines locking groove portions 133B-1 and 133B-2 that communicate with actuating slot 133B and are sized to generally align with lock slots (second locking structures) 119B-1 and 119B-2, respectively, of tubular casing 110B. In one embodiment, actuating slot 133B and locking groove portions 133B-1 and 133B-2 are slightly smaller than actuating opening 118B and lock slots 119B-1 and 119B-2 in order to prevent plastic-on-metal contact between actuating button 163B and tubular casing 110B.

According to another aspect of the present embodiment, a main sleeve portion 136B is integrally molded to and extends from a rear surface of front wall 138B-1 of front cap portion 132B, and includes an upper sleeve wall portion 136B-1, a lower sleeve wall portion 136B-2, and a side sleeve wall portion 136B-3 that collectively form a substantially box-like structure that is sized to fit inside tubular casing 110B such that upper sleeve wall portion 136B-1 presses against an inside surface of upper wall portion 111B-1, lower sleeve wall portion 136B-2 presses against an inside surface of lower wall portion 111B-2, and side sleeve wall portion 136B-3 presses against an inside surface of side wall portion 111B-4.

According to another yet aspect of the present embodiment, a snap-coupling mechanism is implemented by structures formed solely on the plastic housing assembly 130B, thereby further avoiding manufacturing errors due to different manufacturing processes used to form tubular casing 110B and plastic housing assembly 130B. In the present embodiment, the snap-coupling mechanism is formed by a pair of lock pawls (first lock structures) 139B-1 integrally molded on rear cap portion 134B, and a pair of lock grooves (second lock structures) 139B-2 respectively formed on upper sleeve wall portion 136B-1 and lower sleeve wall portion 136B-2. As described below, these structures are disposed such that, when rear cap portion 134B is pressed onto rear end portion 115B of tubular casing 110B when front cap portion 132B is operably fixedly connected over the front end portion 113B, lock pawls 139B-1 snap-couple into the pair of lock grooves 139B-2. Those skilled in the art will recognize that the described lock structures may be reversed (e.g., the pawls formed on sleeve portion 136B and the grooves formed on rear cap portion 134B), or other locking structures may be utilized.

Referring to the lower portion of FIG. 16, sliding rack assembly 140B includes a PCBA 120B having USB plug connector 150B attached thereon, and a box-like plastic positioning member (slide rack) 160B.

Similar to the previously described embodiment, PCBA 120B includes a PCB 121B and plug connector 150B that is attached to a front end of PCB 121B using known techniques.

Positioning member 160B is an integrally molded plastic structure that includes a base portion 161B and a flexible wall 162B that is connected to and separated from base portion 161B by way of an elongated slot (opening) 168B such that flexible wall 162B is resiliently bendable relative to base portion 161B. Press-push button 163B extends upward from flexible wall 162B. Lock tabs (first locking structures) 164B are disposed on flexible surface 162B on opposite sides of button 163B. First and second slide rails 167B-1 and 167B-2 are fixedly connected to and extend substantially perpendicular to base portion 161B, and a third slide rail 167B-3 is connected between ends of first and second slide rails 167B-1 and 167B-2, such that base portion 161B, first slide rail 167B-1, second slide rail 167B-2 and third slide rail 167B-3 define a hollow cavity. Positioning grooves 165B are defined on opposing inside surfaces of base portion 161B and third slide rail 167B-3 and extend through the hollow cavity.

The assembly of press-push flash drive device 100B will now be described with reference to FIGS. 17-19.

Figure 17A:
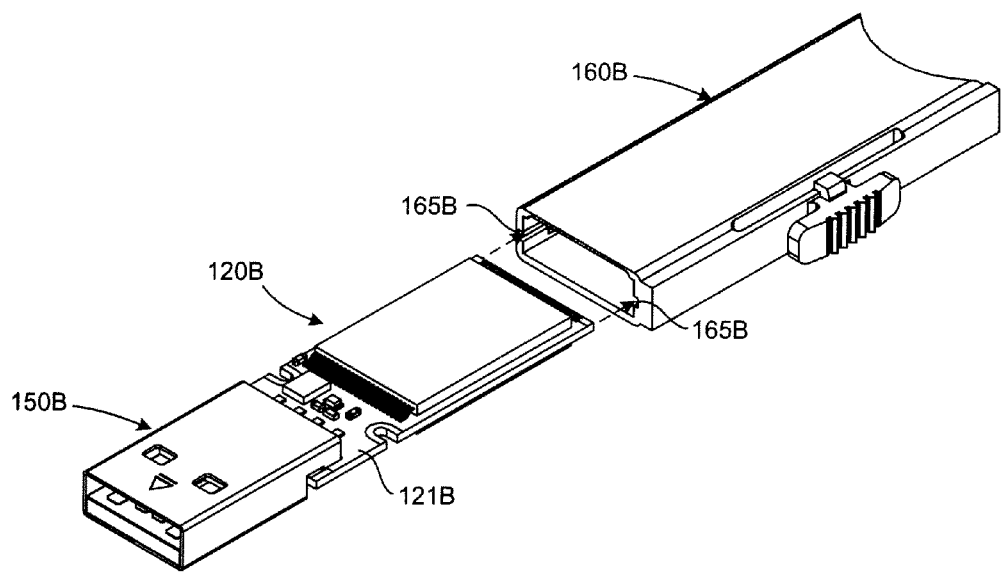
FIGS. 17(A) and 17(B) are exploded perspective and perspective views, respectively, showing a sliding rack assembly of the device of FIG. 15(A) during a first assembly stage according to an aspect of the present embodiment.
Figure 17B:
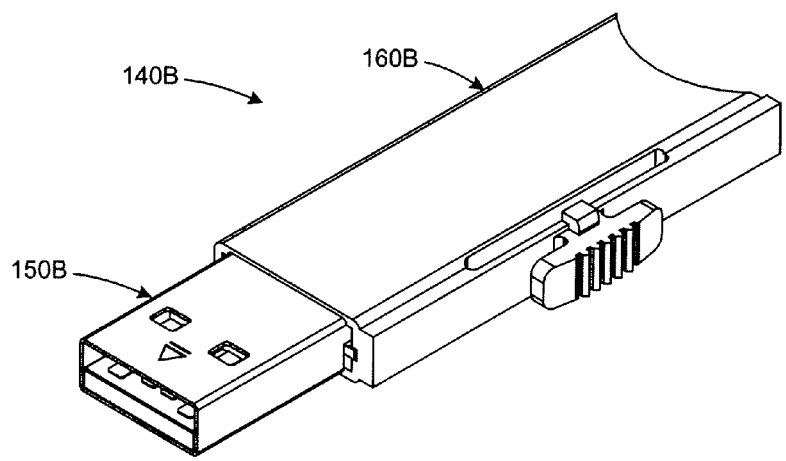
Figure 18A:
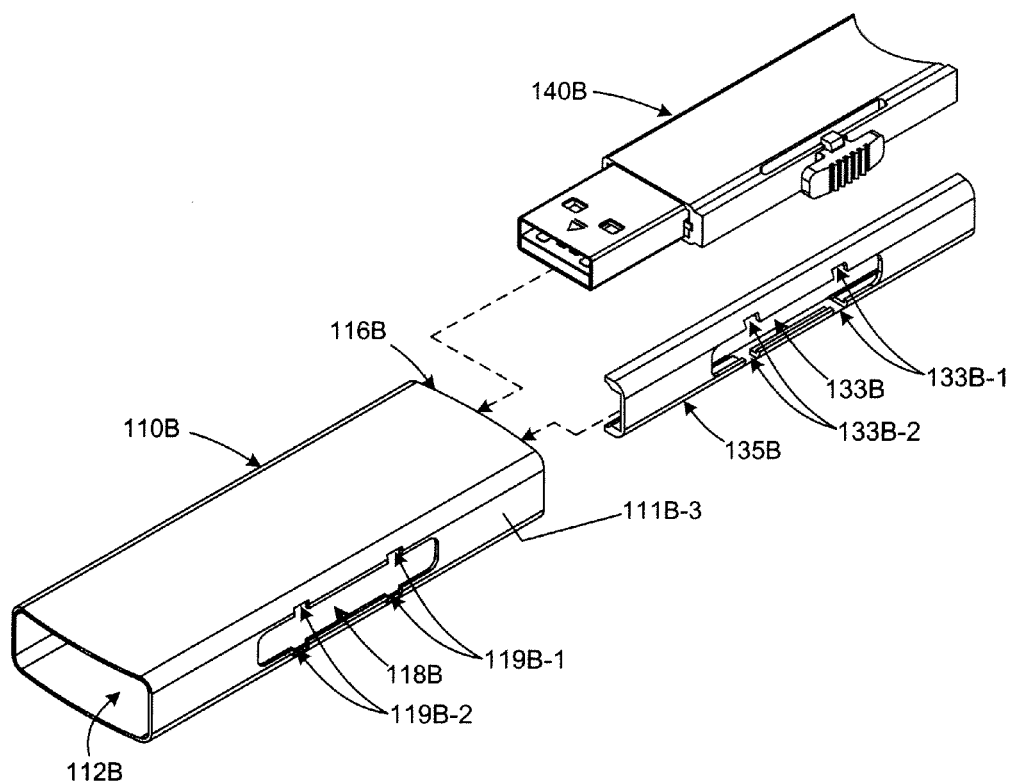
FIGS. 18(A) and 18(B) are exploded perspective and perspective views, respectively, showing the sliding rack assembly of FIG. 17(B) during insertion into a tubular casing during a second assembly stage according to another aspect of the present embodiment.

As indicated in FIGS. 17(A) and 17(B), during a first assembly stage, PCBA 120B (with connector 150B already attached) is inserted into positioning member 160B such that side edges of PCB 121B are engaged with and slide along positioning grooves 165B until connector 150B substantially abuts the end of positioning member 160B, thereby forming carrier assembly 140B.

Figure 18B:
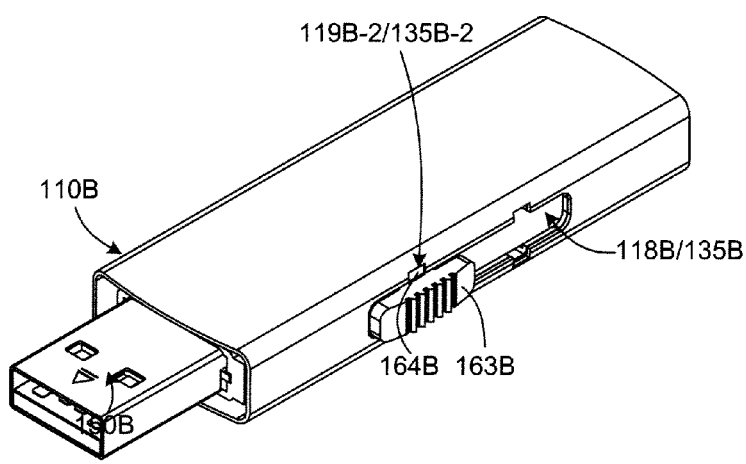

Referring to FIGS. 18(B) and 18(B), during a second assembly stage, side sleeve portion 135B is inserted into inner chamber 112B such that actuating slot 133B is generally aligned with actuating opening 118B of tubular casing 110B, and locking groove portions 133B-1 and 133B-2 are generally aligned with lock slots 119B-1 and 119B-2 of tubular casing 110B, and then carrier assembly 140B is inserted into inner chamber 112B of metal tubular casing 110B (e.g., through rear opening 116B) such that a portion of actuating button 163B protrudes through both actuating slot 133B and actuation slot 118B. As indicated in FIG. 18(B), when assembled such that actuating button 163B is disposed at the front end of actuation slot 118B, lock tabs 164B are engaged in locking groove portions 133B-1 and lock slots 119B-1.

Figure 19A:
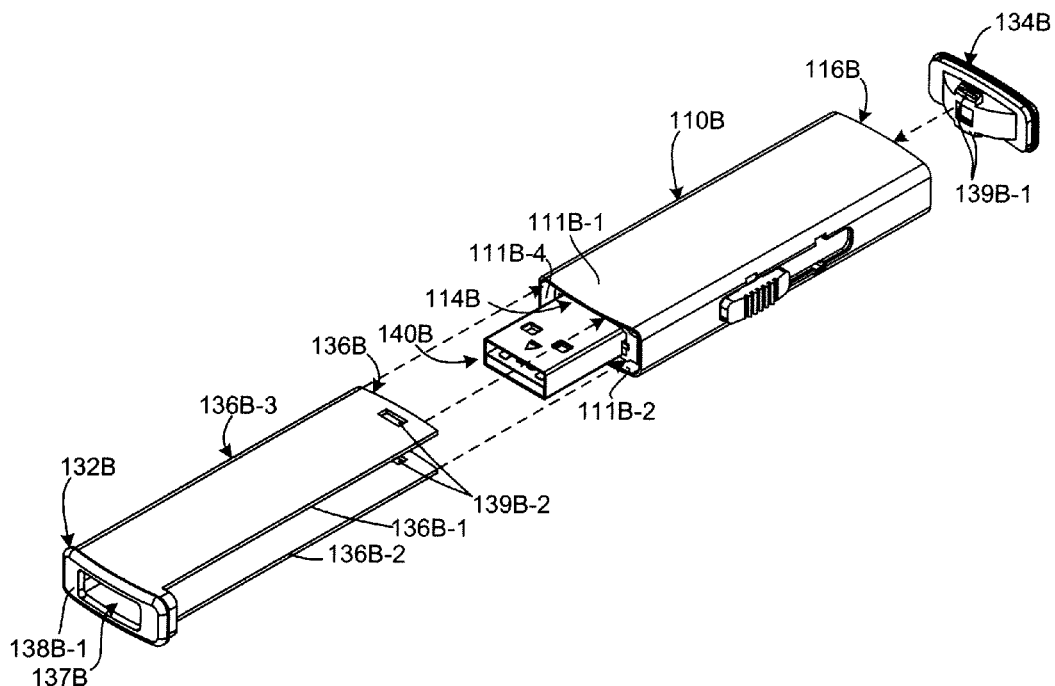
FIGS. 19(A) and 19(B) are exploded perspective and perspective views, respectively, showing the partial assembly of FIG. 18(B) during mounting of a carrier assembly during a third assembly stage according to another aspect of the present embodiment.
Figure 19B:
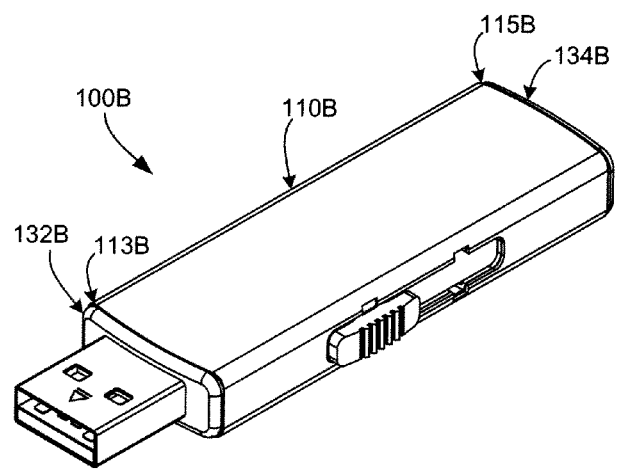

Referring to FIGS. 19(A) and 19(B), during a final assembly stage, front and rear cap portions 132B and 134B of plastic housing assembly 130B are mounted onto front and rear end portions 113B and 115B, respectively, of tubular casing 110B. In particular, front cap portion 132B is mounted onto front end portion 113B such that sleeve portion 136B is inserted between the carrier assembly 140B and tubular casing 110B, and such that plug connector 150B is received inside front opening 137B. In even further detail, sleeve wall portion 136B-1 is inserted between the carrier assembly 140B and upper wall portion 111B-1 of tubular casing 110B, sleeve wall portion 136B-2 is inserted between the carrier assembly 140B and lower wall portion 111B-2, and sleeve wall portion 136B-3 is inserted between the carrier assembly 140E and side wall portion 111B-3. Once front cap portion 132B is fully inserted such that wall 138B-1 covers front end portion 113B, rear cap portion 134B is mounted onto rear end portion 115B such that lock pawls 139B-1 engage (snap-couple into) corresponding locking grooves 139B-2 formed on wall portions 136B-1 and 136B-2. FIG. 19(B) shows device 100B after assembly of front cap portion 132B and rear cap portion 134B onto tubular casing 110B is completed. The operation of device 100B is similar to that described above with reference to FIGS. 14(A) to 14(C). Note that, due to the presence of sleeve portion 136B between tubular casing 110B and carrier assembly 140B (see FIG. 19(A)), when actuating button 163B is pressed into tubular casing 110B during deploy or retract operations, carrier assembly 140B slides on sleeve wall portion 136B-3 instead of on tubular casing 110B, thereby avoiding plastic-on-metal wear.

Figure 20A:
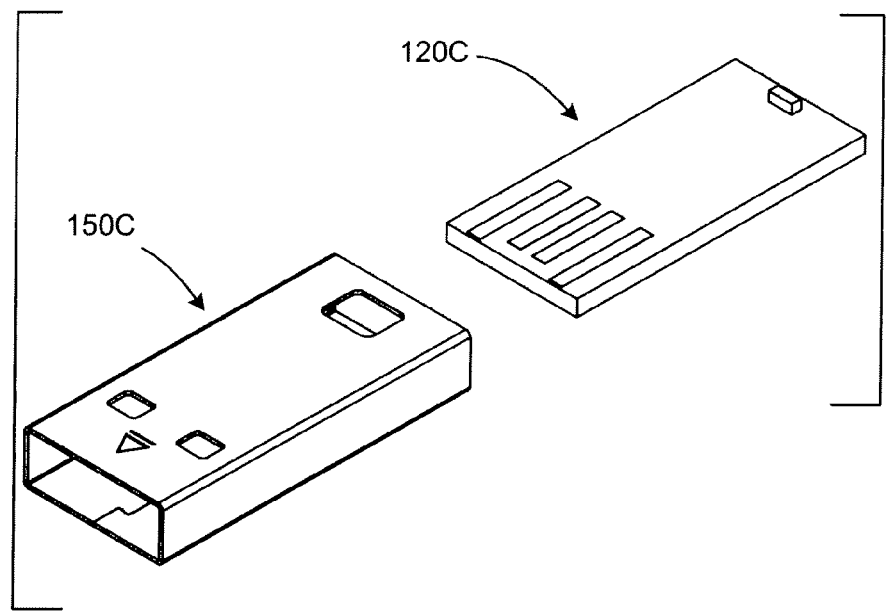
FIGS. 20(A) and 20(B) are exploded perspective views showing alternative PCBA and USB plug connector arrangements according to alternative embodiments of the invention.
Figure 20B:
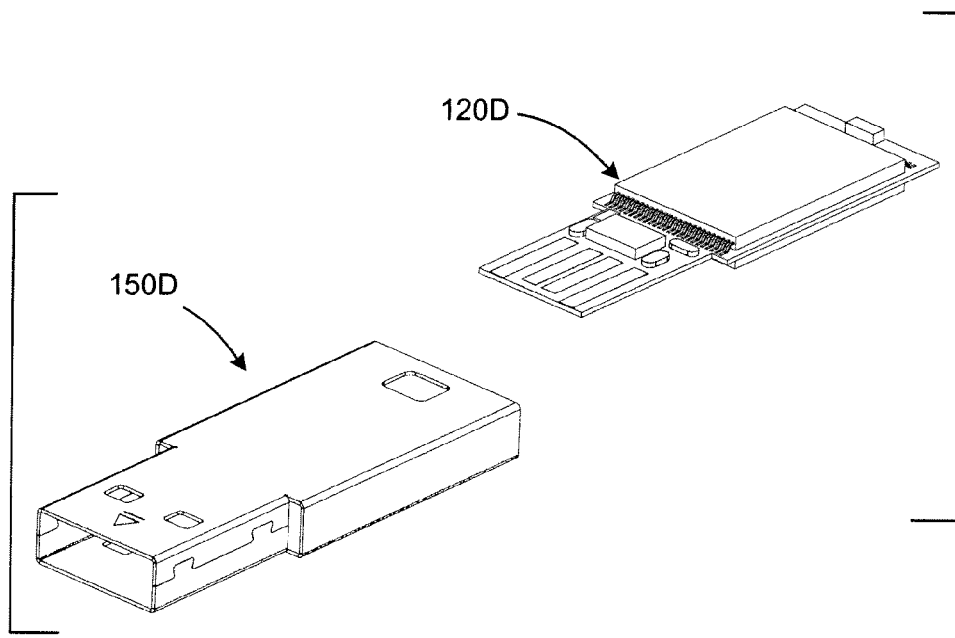

FIGS. 20(A) and 20(B) are exploded perspective views showing alternatives PCBA 120C and 120D and alternative USB plug connectors 150C and 150D according to alternative embodiments of the invention. As described previously, a sliding rack assembly includes a PCBA (e.g., 120A; see FIG. 9), a USB plug connector (e.g., connector 150A; see FIG. 9), and a slide rack (e.g., positioning member 160A; see FIG. 9). Similar arrangements are described above with reference to the various additional embodiments. In accordance with additional alternative embodiments of the present invention, PCBAs 120A and 120B and USB plug connectors 150A and 150B of these various embodiments can be replaced by alternative PCBAs 120C and 120D and connectors 150C and 150D shown in FIGS. 20(A) and 20(B). In particular, FIG. 20(A) shows a Chip-On-Board (COB) PCBA 120C and a standard metal USB plug 150C, wherein COB PCBA 120C includes the memory, I/O and processor circuits described above that are mounted in chip (i.e., unpackaged) form onto a printed circuit board substrate, and then overmolded with a suitable plastic material. Similarly, FIG. 20(B) shows a Slim Printed Circuit Board Assembly (Slim PCBA) 120D and a modified metal USB plug shell 150D.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a USB connector has been shown and described, other types of connectors such as a Secure Digital (SD) interface circuit, a Micro SD interface circuit, a Multi Media Card (MMC) interface circuit, a Compact Flash (CF) interface circuit, a Memory Stick (MS) interface circuit, a PCI-Express interface circuit, an Integrated Drive Electronics (IDE) interface circuit, a Serial Advanced technology Attachment (SATA) interface circuit, an external SATA interface circuit, a Radio Frequency Identification (RFID) interface circuit, a fiber channel interface circuit, and an optical connection interface circuit may be used to achieve the same function. Additionally, whereas the size of the data area of a page has been shown to hold four sectors of 512-data, a page holds other number of sectors such as eight may be used. Further, although the present invention is describe with specific reference to tubular casings formed from a metal material, beneficial aspects of the present invention may also be utilized formed using other suitable materials, such as hard plastic or ceramic. In summary, the scope of the invention should not be restricted to the specific exemplary embodiments disclosed herein, and all modifications that are readily suggested to those of ordinary skill in the art should be included within the spirit and purview of this application and scope of the appended claims.

The invention claimed is:

1. A press-push flash drive apparatus comprising:
a tubular casing including an integral tubular wall defining an inner chamber, the tubular wall having a front end portion defining a first opening, a rear end portion defining a second opening, and a third opening defined in the tubular wall between the front and rear end portions;
a plastic housing assembly including first cap portion fixedly connected over the front end portion of the tubular casing, a second cap portion fixedly connected over the rear end portion of the tubular casing, and a sleeve portion disposed in the inner chamber of the tubular casing between the first cap portion and the second cap portion, wherein the first cap portion defines a front opening; and
a carrier assembly disposed in the inner chamber of the tubular casing, the carrier assembly comprising:
a printed circuit board assembly (PCBA) disposed in the inner chamber of the tubular casing and including at least one electronic device,
a plug connector fixedly connected to the PCBA and electronically connected to said at least one electronic device, and
a plastic positioning member disposed in the inner chamber of the tubular casing and including an actuating button protruding through the third opening of the tubular casing, the positioning member being fixedly connected to the PCBA and restricted to slide in the inner chamber such that manual movement of actuating button along the third opening causes the plug connector to move between a first position, in which the plug connector extends through the front opening such that the plug connector is exposed outside of the tubular casing, and a second position in which the plug connector is entirely disposed in the inner chamber of the tubular casing,
wherein the positioning member is disposed relative to the sleeve portion such that when the actuating button is manually pushed along the third opening during movement of the plug connector between the first and second positions, a portion of the positioning member slides against the sleeve portion.

2. The apparatus according to claim 1, wherein the plastic housing assembly comprises a snap-coupling mechanism arranged such that, when the plastic housing assembly is mounted onto the tubular casing and the snap-coupling mechanism is operably engaged, the tubular casing is fixedly and rigidly held between the front and rear cap portions, and the sleeve portion is rigidly held in the inner chamber of the tubular casing.

3. The apparatus according to claim 2,
wherein each of the front and rear cap portions comprise elongated lock pawls, and
wherein the tubular casing comprises elongated lock grooves that are shaped and arranged such that, when one of the front and rear cap portions is pressed onto an associated one of the front and rear end portions of the tubular casing, the elongated lock pawl snap-couples into the elongated lock grooves to secure said one of the front and rear cap portions to the tubular casing.

4. The apparatus according to claim 2, wherein the sleeve portion is integrally molded with the front cap portion and sized to fit between the tubular wall and the positioning member when the front cap portion is operably fixedly connected over the front end portion of the tubular casing.

5. The portable computer peripheral apparatus according to claim 4,
wherein the rear cap portion comprises at least one first lock structure, and
wherein the sleeve portion comprises at least one second lock structure that is shaped and arranged such that, when the rear cap portion is pressed onto the rear end portion of the tubular casing when the front cap portion is operably fixedly connected over the front end portion of the tubular casing, the at least one first lock structure engages with the at least one second lock structure.

6. The apparatus according to claim 5,
wherein the at least one first lock structure comprises a pair of lock pawls,
wherein the at least one second lock structure comprises a pair of lock grooves, and
wherein the pair of lock pawls are disposed such that, when the rear cap portion is pressed onto the rear end portion of the tubular casing when the front cap portion is operably fixedly connected over the front end portion of the tubular casing, the pair of lock pawls snap-couple into the pair of lock grooves.

7. The apparatus according to claim 4, wherein the plastic housing assembly further comprises a side sleeve portion disposed between the positioning member and the tubular wall and defines an actuating slot that is sized to generally align with the third opening of the tubular casing such that the actuating button protrudes through both the actuating slot of the side sleeve portion and the third opening of the tubular casing.

8. The apparatus according to claim 7,
wherein the positioning member further comprises at least one first locking pawl disposed adjacent to the actuating button,
wherein the side sleeve portion further defines first and second locking groove portions that communicate with the actuating slot, and
wherein the positioning member is mounted in the tubular casing such that the at least one first locking pawl engages the first locking groove portion when the plug connector is in the first position, and such that the at least one first locking pawl engages the second locking groove when the plug connector is in the second position.

9. The apparatus according to claim 1,
wherein the positioning member further comprises at least one first locking structure disposed adjacent to the actuating button,
wherein the tubular casing further comprises a second locking structure and a third locking structure, and
wherein the positioning member is mounted in the tubular casing such that the first locking structure engages the second locking structure when the plug connector is in the first position, and such that the first locking structure engages the third locking structure when the plug connector is in the second position.

10. The portable computer peripheral apparatus according to claim 1, wherein the positioning member comprises:
a base portion,
first and second side walls fixedly connected to opposing side edges of the base portion; and
a flexible wall connected to the base portion such that the flexible wall is resiliently bendable relative to the base portion,
wherein the actuating button comprises a press-push button disposed on the flexible wall such that when the press-push button is pressed into the tubular casing, the first and second slide rails press against the sleeve portion such that the flexible wall bends into the housing.

11. The apparatus of claim 10,
wherein the positioning member further comprises a first locking structure disposed on the flexible wall,
wherein the housing further comprises a second locking structure and a third locking structure, and
wherein the positioning member is mounted in the housing such that the first locking structure engages the second locking structure when the plug connector is in the first position, and such that the first locking structure engages the third locking structure when the plug connector is in the second position.

12. The apparatus according to claim 1, wherein the tubular casing comprises a metal structure having parallel upper and lower wall portions integrally connected by opposing first and second side wall portions.

13. The apparatus according to claim 12, wherein the third opening is defined in the upper wall portion of the metal structure, and the positioning member is disposed inside the tubular casing such that the actuating button extends through the upper wall portion.

14. The apparatus according to claim 12, wherein the third opening is defined in one of the side wall portions of the metal structure, and the positioning member is disposed inside the tubular casing such that the actuating button extends through said one of the side wall portion.

15. The apparatus of claim 1, wherein said at least one electronic device disposed in a Chip-On-Board (COB) package.

16. The apparatus of claim 1, wherein said at least one electronic device disposed in a Slim Printed Circuit Board Assembly (Slim PCBA) package.

17. The apparatus of claim 1, wherein the plug connector comprises a Universal Serial Bus (USB) plug.

18. The apparatus of claim 1, wherein the at least one electronic device comprises
an input/output interface circuit, coupling to a processing unit, configured for receiving a logical sector address (LSA) along with a data transfer request from a host computing device, said processing unit is configured for extracting set, entry, page and sector numbers from the LSA with an indexing scheme;
wherein said processing unit further comprises a page buffer, an address correlation page usage memory (ACPUM), a partial logical-to-physical address and page usage information (PLTPPUI) tracking table, a wear leveling counter and bad block indicator (WL/BB) tracking table; and
a flash memory that includes a reserved area for a plurality of first physical blocks and a plurality of second physical blocks, the first physical blocks is referenced by a plurality of first special logical addresses while the second physical blocks by a plurality of second special logical addresses;
wherein the plurality of first physical blocks is configured for storing PLTPPUI and the plurality of second physical blocks for storing wear leveling and bad block indicator, ACPUM is configured to keep one set, corresponding to the set number, of PLTPPUI, the PLTPPUI tracking table is configured to hold correlation between the first special logical addresses and the first physical blocks and the WL/BB tracking table is configured to hold correlation between the second special logical addresses and the second physical blocks.

19. The apparatus of claim 1, wherein the at least one electronic device comprises:
at least one MLC based flash memory chip and a flash memory controller mounted thereon,
wherein the flash memory controller is configured for managing memory address of the flash memory device with following operations:
receiving, in the MLC based flash memory device, a logical sector address (LSA) along with a data transfer request from a host computing device;
extracting set, entry, page and sector numbers from the LSA with an indexing scheme;
loading a set, corresponding to the set number, of partial logical-to-physical address and page usage information (PLTPPUI) into an address correlation page usage memory (ACPUM);
reading a physical block number of flash memory of the MLC based flash memory device, the physical block number corresponds to the entry number in the ACPUM; and
when the data transfer request is a read request, reading data from a physical page corresponding to the page number of the physical block number of the flash memory to a page buffer, and sending a request data sector from the page buffer in accordance with the sector number;
when the data transfer request is a write request, writing page buffer contents to the physical page corresponding to the page number of the physical block number of the flash memory if the page buffer contents have been modified, writing a received data sector to the page buffer in accordance with the sector number and setting corresponding one of a plurality of sector update flags reflecting data sector just written to the page buffer.

20. The apparatus of claim 19, wherein said plug connector includes an interface circuit of one of Universal Serial Bus (USB), Secure Digital (SD), Micro SD, Multi-Media Card (MMC), Compact Flash (CF), Memory Stick (MS), PCI-Express, a Integrated Drive Electronics (IDE), Serial Advanced Technology Attachment (SATA), external SATA, Radio Frequency Identification (RFID), fiber channel and optical connection.

* * * * *